United States Patent
Kurokawa

(10) Patent No.: US 9,799,774 B2
(45) Date of Patent: Oct. 24, 2017

(54) SWITCH CIRCUIT, SEMICONDUCTOR DEVICE, AND SYSTEM

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/023,460

(22) PCT Filed: Sep. 11, 2014

(86) PCT No.: PCT/JP2014/074756
§ 371 (c)(1),
(2) Date: Mar. 21, 2016

(87) PCT Pub. No.: WO2015/046025
PCT Pub. Date: Apr. 2, 2015

(65) Prior Publication Data
US 2016/0211381 A1    Jul. 21, 2016

(30) Foreign Application Priority Data
Sep. 26, 2013  (JP) ................. 2013-199115

(51) Int. Cl.
*H01L 29/786* (2006.01)
*H03K 17/16* (2006.01)
(Continued)

(52) U.S. Cl.
CPC ...... *H01L 29/7869* (2013.01); *H01L 27/0207* (2013.01); *H01L 27/1207* (2013.01);
(Continued)

(58) Field of Classification Search
CPC ............. H01L 27/0207; H01L 27/1207; H01L 29/7869; H03K 17/165
See application file for complete search history.

(56) References Cited

U.S. PATENT DOCUMENTS

| 4,303,831 A | 12/1981 | El Hamamsy |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

International Search Report/Written Opinion in PCT/JP2014/074756 mailed Dec. 16, 2014, 6 pages.

(Continued)

*Primary Examiner* — Allan R Wilson
(74) *Attorney, Agent, or Firm* — Fish & Richardson P.C.

(57) ABSTRACT

A switch circuit that can control an electrical connection state without additionally providing a control circuit is provided. The switch circuit includes a transistor, a first switch which control an electrical connection state between a gate of the transistor and a wiring, a second switch, a first diode including an anode and a cathode, a third switch, and a second diode including an anode and a cathode. An electrical connection state between the anode of the first diode and the gate of the transistor is controlled by the second switch, and the cathode of the first diode is electrically connected to a source of the transistor. An electrical connection state between the anode of the second diode and the gate of the transistor is controlled by the third switch, and the cathode of the second diode is electrically connected to a drain of the transistor.

23 Claims, 17 Drawing Sheets

(51) Int. Cl.
*H01L 27/02* (2006.01)
*H01L 27/12* (2006.01)
*G11C 7/10* (2006.01)

(52) U.S. Cl.
CPC ......... *H03K 17/165* (2013.01); *G11C 7/1006* (2013.01); *H03K 2217/0054* (2013.01)

(56) References Cited

U.S. PATENT DOCUMENTS

| | | | |
|---|---|---|---|
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,313,665 | B1 * | 11/2001 | Sasaki ................. H01L 27/0207 |
| | | | 257/206 |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0018466 | A1 | 2/2002 | Arai |
| 2002/0051390 | A1 * | 5/2002 | Nagaya ..................... G11C 7/20 |
| | | | 365/200 |
| 2002/0056838 | A1 | 5/2002 | Ogawa |
| 2002/0132454 | A1 | 9/2002 | Ohtsu et al. |
| 2003/0160639 | A1 * | 8/2003 | Saito .................. H03F 3/45219 |
| | | | 327/108 |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0057705 | A1 * | 3/2007 | Kanzaki ........... H03K 17/04206 |
| | | | 327/112 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0211567 | A1 | 9/2008 | Morita et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0167411 | A1 | 7/2009 | Machida et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0089417 | A1 | 4/2011 | Yamazaki et al. |
| 2011/0101351 | A1 | 5/2011 | Yamazaki |
| 2011/0134683 | A1 * | 6/2011 | Yamazaki ............. G11C 11/405 |
| | | | 365/149 |
| 2012/0075904 | A1 * | 3/2012 | Matsumoto ....... H01L 27/10897 |
| | | | 365/72 |
| 2014/0167041 | A1 | 6/2014 | Yamazaki et al. |

FOREIGN PATENT DOCUMENTS

| | | |
|---|---|---|
| JP | 56500952 T | 7/1981 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 9135244 A | 5/1997 |
| JP | 11-505377 | 5/1999 |
| JP | 2000-044236 A | 2/2000 |
| JP | 2000-150900 A | 5/2000 |
| JP | 2002051105 A | 2/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009124667 A | 6/2009 |

(56) References Cited

FOREIGN PATENT DOCUMENTS

| JP | 2009159222 A | 7/2009 |
|---|---|---|
| WO | WO8100493 A1 | 2/1981 |
| WO | WO-2004/114391 | 12/2004 |

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri et al., "A Semi-Static Complementary Gain Cell Technology for Sub-1 V Supply DRAM's ", IEEE Transactions on Electron Devices, Jun. 1, 1994, vol. 41, No. 6, pp. 926-931.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45,A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

10

SWITCH CIRCUIT, SEMICONDUCTOR DEVICE, AND SYSTEM

TECHNICAL FIELD

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a memory device, a driving method thereof, or a manufacturing method thereof. In particular, one embodiment of the present invention relates to a switch circuit including a transistor, and a semiconductor device or a system in which switching between a component of a main system and a component of a waiting system can be performed by using the switch circuit.

BACKGROUND ART

As examples of a computer system or a communication system having a redundant configuration including a component of a waiting system in addition to a component of a main system, there are a duplex system, a dual system, and a multiprocessor system. Each of these systems has a feature of preventing a stop of the entire system by isolating a component in which a problem has arisen from the other components with a switch.

Patent Document 1 discloses a cell switch switching method in which a switching operation between an active cell switch and a standby cell switch is controlled by a system controller. Furthermore, Patent Document 2 discloses communication parts including electronic circuit packages used as an operating system or a waiting system, a switch which changes a system, and a switch control station which changes and controls the switch.

REFERENCE

Patent Document

[Patent Document 1] Japanese Published Patent Application No. H9-135244
[Patent Document 2] Japanese Published Patent Application No. 2002-51105

DISCLOSURE OF INVENTION

In Patent Documents 1 and 2, a control circuit needs to be prepared additionally in order to control switching of the switch that switches between the waiting system and the main system. Furthermore, to keep an electrical connection state of the switch, a storage device such as a register for keeping an electrical connection state is generally necessary. Thus, a variety of systems such as a computer system or a communication system having a redundant configuration tend to entirely have a complicated structure owing to the control circuit or the storage device that is provided accompanying the switch.

In view of the above-described technical background, it is an object of one embodiment of the present invention to provide a switch circuit that can control an electrical connection state without additionally providing a control circuit. An object of one embodiment of the present invention is to provide a switch circuit that can keep an electrical connection state. An object of one embodiment of the present invention is to provide a semiconductor device or a system which has a simple structure and can switch the electrical connection state between a plurality of components. An object of one embodiment of the present invention is to provide a semiconductor device or a system which has a simple structure and can switch between a component of a main system and a component of a waiting system. An object of one embodiment of the present invention is to provide a novel semiconductor device or the like. Note that the descriptions of these objects do not disturb the existence of other objects. In one embodiment of the present invention, there is no need to achieve all of these objects. Other objects will be apparent from and can be derived from the description of the specification, the drawings, the claims, and the like.

A switch circuit of one embodiment of the present invention includes a transistor; a first switch configured to control an electrical connection state between a gate of the transistor and a wiring; a second switch; a first diode comprising an anode and a cathode, in which an electrical connection state between the anode and the gate of the transistor is controlled by the second switch and the cathode is electrically connected to a source of the transistor; a third switch; and a second diode comprising an anode and a cathode, in which an electrical connection state between the anode and the gate of the transistor is controlled by the third switch and the cathode is electrically connected to a drain of the transistor.

A switch circuit of one embodiment of the present invention includes a first transistor, a second transistor, a third transistor, a fourth transistor, a fifth transistor, and a sixth transistor. In the switch circuit, an electrical connection state between a gate of the first transistor and a wiring is controlled by the second transistor. An electrical connection state between a gate of the fourth transistor and the gate of the first transistor is controlled by the third transistor. The gate of the fourth transistor is electrically connected to one of a source or a drain of the fourth transistor, and the other of the source and the drain of the fourth transistor is electrically connected to a source of the first transistor. An electrical connection state between a gate of the sixth transistor and the gate of the first transistor is controlled by the fifth transistor. The gate of the sixth transistor is electrically connected to one of a source and a drain of the sixth transistor, and the other of the source and the drain of the sixth transistor is electrically connected to a drain of the first transistor.

A semiconductor device of one embodiment of the present invention includes the switch circuit described above, a first component configured to output a signal to the source of the first transistor, and a second component to which the signal is input from the drain of the first transistor.

A system of one embodiment of the present invention includes the switch circuit described above, a first component configured to output a signal to the source of the first transistor, and a second component to which the signal is input from the drain of the first transistor.

With one embodiment of the present invention, a switch circuit that can control an electrical connection state without additionally providing a control circuit is provided. With one embodiment of the present invention, a switch that can keep an electrical connection state is provided. With one embodiment of the present invention, a semiconductor device or a system which has a simple structure and can switch between a component of a main system and a component of a waiting system is provided. With one embodiment of the present invention, a novel semiconductor device or the like is provided.

BEST MODE FOR CARRYING OUT THE INVENTION

Embodiments of the present invention will be described in detail below with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that one embodiment of the present invention includes, in its category, any semiconductor device using a switch circuit, such as integrated circuits, RF tags, and semiconductor display devices. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). The semiconductor display devices include, in its category, semiconductor display devices in which a switch circuit is included in a driver circuit, such as liquid crystal display devices, light-emitting devices in which a light-emitting element typified by an organic light-emitting element (OLED) is provided in each pixel, electronic papers, digital micromirror devices (DMDs), plasma display panels (PDPs), field emission displays (FEDs), and the like.

<Structure Example 1 of Switch Circuit>

Figure 1:
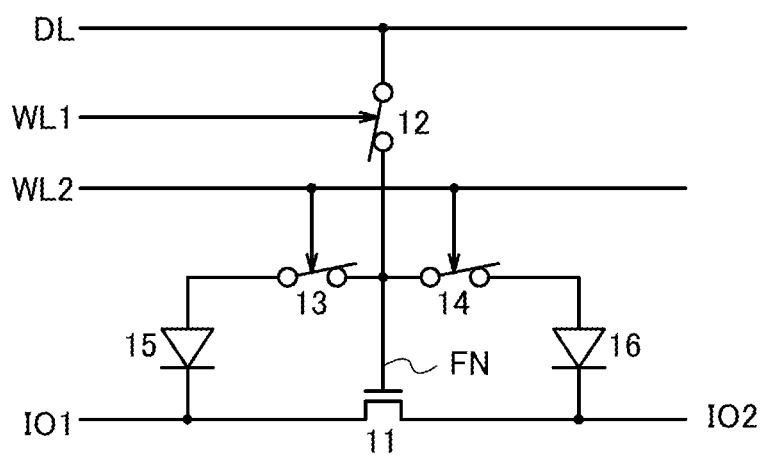
FIG. 1 illustrates a structure of a switch circuit.

FIG. 1 illustrates an example of a structure of a switch circuit 10 of one embodiment of the present invention. The switch circuit 10 illustrated in FIG. 1 includes a transistor 11, a switch 12, a switch 13, a switch 14, a diode 15, and a diode 16.

The transistor 11 has a function of controlling the electrical connection state between a wiring IO1 and a wiring IO2. Specifically, one of a source or a drain of the transistor 11 is connected to the wiring IO1, and the other of the source and the drain is connected to the wiring IO2.

The switch 12 has a function of controlling the electrical connection state between a gate of the transistor 11, which corresponds to a node FN, and a wiring DL. In accordance with a signal input to a wiring WL1, the switch 12 is turned on (conducting) or off (non-conducting), that is, switching of the switch 12 is controlled.

The switch 13 has a function of controlling the electrical connection state between the gate of the transistor 11 and an anode of the diode 15. Switching of the switch 13 is controlled with a signal input to a wiring WL2. A cathode of the diode 15 is connected to the wiring IO1.

The switch 14 has a function of controlling the electrical connection state between the gate of the transistor 11 and an anode of the diode 16. Switching of the switch 14 is controlled with a signal input to the wiring WL2. A cathode of the diode 16 is connected to the wiring IO2.

With the above-described structure, the switch circuit 10 can control the electrical connection state between the wiring IO1 and the wiring IO2 in accordance with a potential of the wiring IO1 or the wiring IO2. Specifically, in the switch circuit 10 illustrated in FIG. 1, when the switch 12 is on, a high-level potential is supplied from the wiring DL to the node FN. Then, the switch 12 is turned off, and one or both of the switches 13 and 14 is/are turned on. At this time, if the potential of the wiring IO1 or the wiring IO2 is the same as or higher than the potential of the node FN, transfer of charges through the diode 15 or 16 does not occur between the wiring IO1 or IO2 and the node FN; accordingly, the high-level potential is kept in the node FN. In contrast, if the potential of the wiring IO1 or the wiring IO2 is lower than the potential of the node FN, charges transfer between the wiring IO1 or IO2 and the node FN through the diode 15 or 16; consequently, the potential of the node FN becomes quite close to the potential of the wiring IO1 or IO2 and becomes a low-level potential.

In the example of the switch circuit 10 illustrated in FIG. 1, because the transistor 11 is of an n-channel type, the transistor 11 is on when the potential of the node FN is high and off when the potential of the node FN is low. The potential of the node FN is kept by turning off the switches 12 to 14, and the electrical connection state of the transistor 11 is kept as long as the potential of the node FN is kept.

Figure 13:
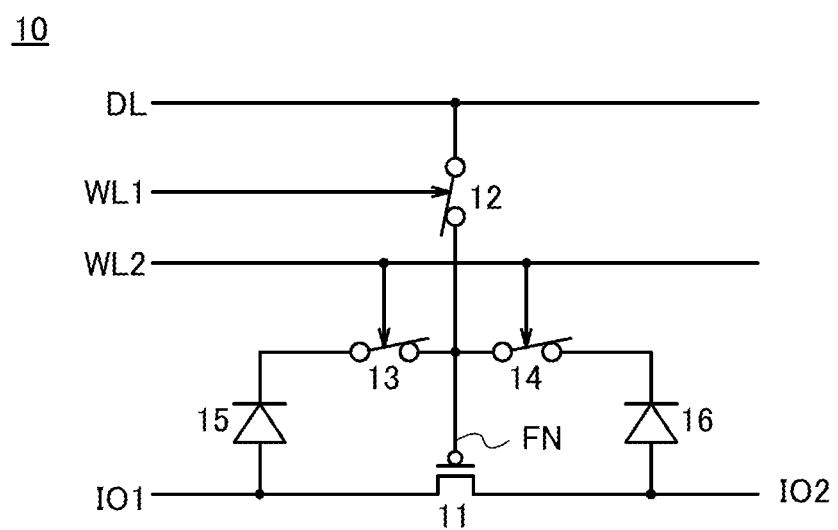
FIG. 13 illustrates a structure of a switch circuit.

Note that in the case where the transistor 11 is of a p-channel type in the switch circuit 10 illustrated in FIG. 1, the anodes and the cathodes of the diodes 15 and 16 are reversed as illustrated in FIG. 13. Specifically, the anode of the diode 15 is connected to the wiring IO1, and the cathode of the diode 15 is connected to the gate of the transistor 11 through the switch 13. In addition, the anode of the diode 16 is connected to the wiring IO2, and the cathode of the diode 16 is connected to the gate of the transistor 11 through the switch 14.

Also in the case where the transistor 11 is of a p-channel type, the switch circuit 10 can control the electrical connection state between the wiring IO1 and the wiring IO2 in accordance with the potential of the wiring IO1 or the wiring IO2. Specifically, in the switch circuit 10 including the p-channel transistor 11, when the switch 12 is on, a low-level potential is supplied from the wiring DL to the node FN. Then, the switch 12 is turned off, and one or both of the switches 13 and 14 is/are turned on. At this time, if the potential of the wiring IO1 or the wiring IO2 is the same as or lower than the potential of the node FN, transfer of charges through the diode 15 or 16 does not occur between the wiring IO1 or IO2 and the node FN; accordingly, the low-level potential is kept in the node FN. In contrast, if the potential of the wiring IO1 or the wiring IO2 is higher than the potential of the node FN, charges transfer between the wiring IO1 or IO2 and the node FN through the diode 15 or 16; consequently, the potential of the node FN becomes quite close to the potential of the wiring IO1 or IO2 and becomes a high-level potential.

In the case where the transistor 11 is of a p-channel type, the transistor 11 is on when the potential of the node FN is low and off when the potential of the node FN is high. The potential of the node FN is kept by turning off the switches 12 to 14, and the electrical connection state of the transistor 11 is kept as long as the potential of the node FN is kept.

Figure 14A:
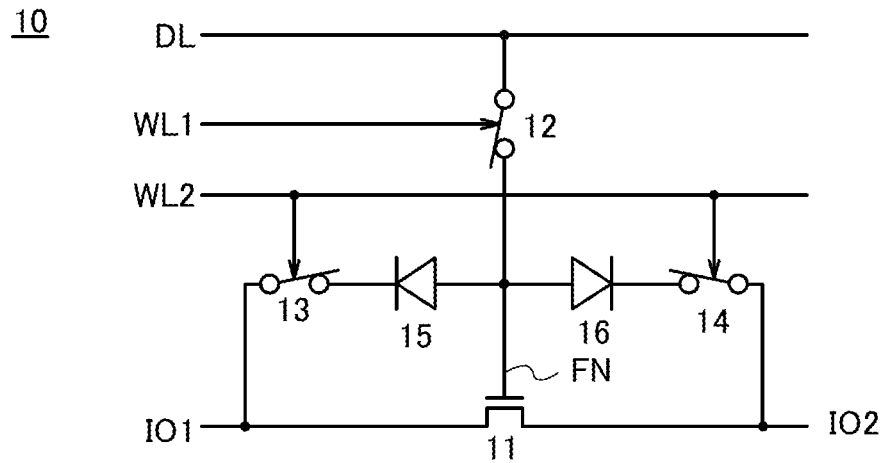
FIGS. 14A to 14C each illustrate a structure of a switch circuit.
Figure 14B:
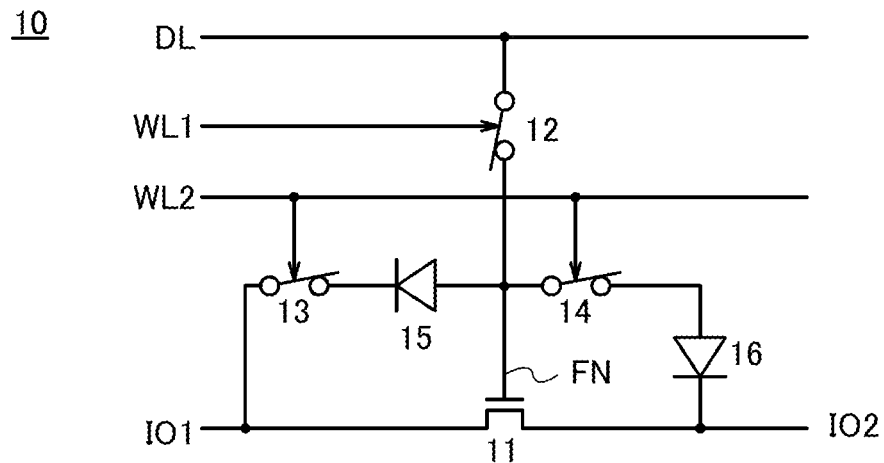
Figure 14C:
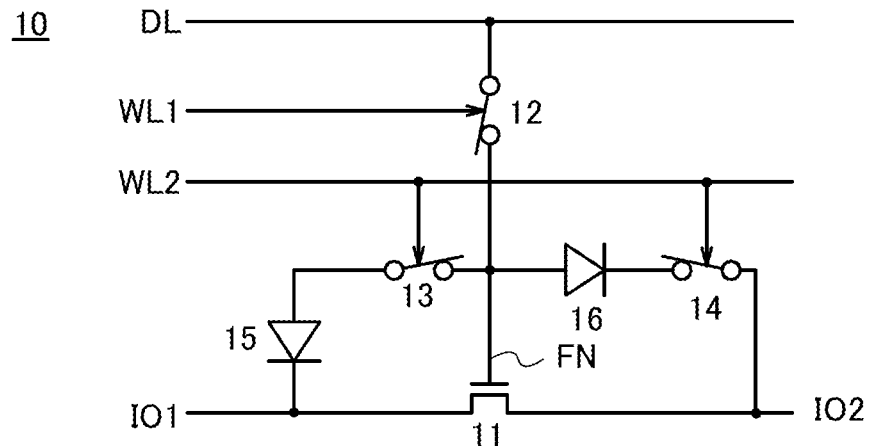
Figure 15A:
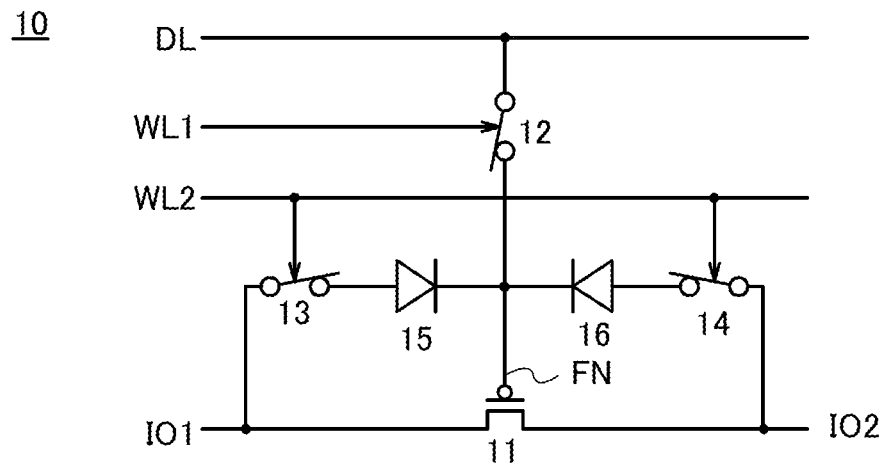
FIGS. 15A to 15C each illustrate a structure of a switch circuit.
Figure 15B:
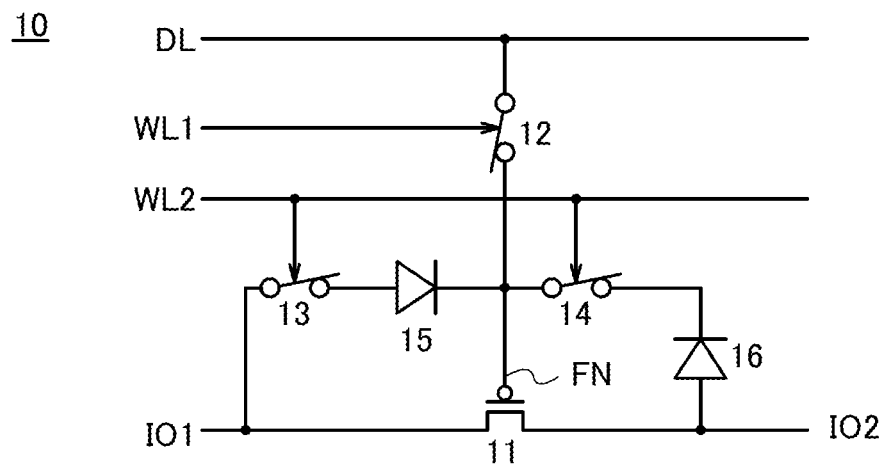
Figure 15C:
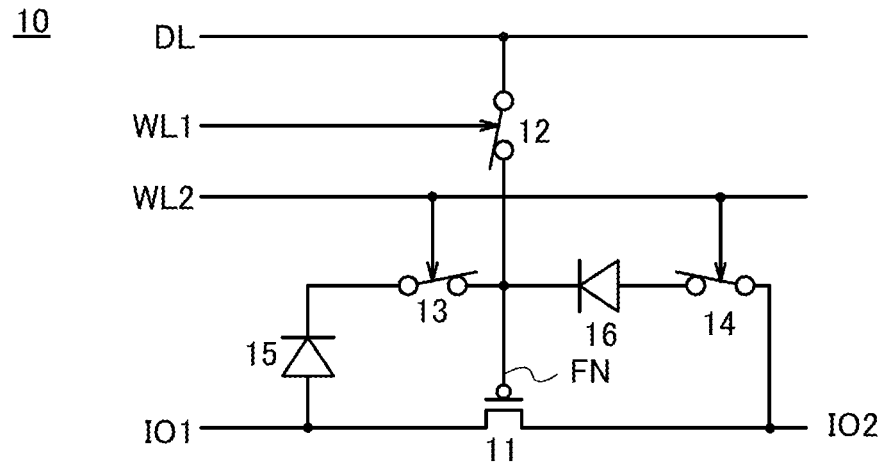

As long as the diode 15 and the switch 13 are connected in series between the node FN and the wiring IO1, a current flowing between the node FN and the wiring IO1 can be controlled. Accordingly, the connection order of the switch 13 and the diode 15 or the connection order of the switch 14 and the diode 16 in FIG. 1 may be reversed. An example in which both of the connection orders are reversed is illustrated in FIG. 14A. FIGS. 14B and 14C each illustrate an example in which either of the connection orders is reversed. Note that the same applies to the switch circuit 10 illustrated in FIG. 13 in which the transistor 11 is of a p-channel type; examples are illustrated in FIGS. 15A to 15C.

As described above, the switch circuit 10 of one embodiment of the present invention can control the electrical connection state between the wiring IO1 and the wiring IO2 in accordance with the potential of the wiring I01 or the wiring IO2. Thus, in the case where the wiring I01 and the wiring IO2 are used for input/output of a signal between a plurality of components, the electrical connection state of the switch circuit 10 can be set by using the potential of a signal supplied from any of the plurality of components to the wiring IO1 or IO2. In other words, in one embodiment of the present invention, the electrical connection state of the switch circuit 10 can be controlled without additionally providing a circuit for controlling the electrical connection state of the switch circuit 10.

Furthermore, in one embodiment of the present invention, transistors with significantly low off-state current are used as the switches 12 to 14, whereby leakage of charges from the node FN can be prevented when the switches 12 to 14 are off. As a result, the potential of the node FN can be kept for a long period. That is, in one embodiment of the present invention, the above-described structure can give the switch circuit 10 a function of a storage device. Thus, it is not necessary to additionally provide a storage device such as a register for keeping the electrical connection state of the switch circuit 10.

Note that "off-state current" in this specification refers to current flowing in a cut-off region between a source and a drain of a transistor, unless otherwise specified.

A transistor including a channel formation region in a film of a semiconductor having a wider band gap and lower intrinsic carrier density than silicon can have significantly low off-state current and thus is suitable as the switches 12 to 14. Examples of such a semiconductor are an oxide semiconductor and gallium nitride that have a band gap more than or equal to twice the band gap of silicon. A transistor including the semiconductor can have a much lower off-state current than a transistor including a normal semiconductor such as silicon or germanium. By using the transistors having the above-described structure as the switches 12 to 14, leakage of charges from the node FN can be prevented and the electrical connection state of the switch circuit 10 can be kept for a long period.

FIG. 1 illustrates the case where the transistor 11 has a single-gate structure including one gate and one channel formation region. In the switch circuit of one embodiment of the present invention, the transistor 11 may have a multi-gate structure including a plurality of electrically connected gates and a plurality of channel formation regions.

In FIG. 1, the transistor 11 has the gate on at least one side of a semiconductor film. The transistor 11 may have a pair of gates with a semiconductor film positioned therebetween. When one of the pair of gates is regarded as a back gate, potentials at the same level may be supplied to a normal gate and the back gate, or a fixed potential such as a ground potential may be supplied only to the back gate. By controlling the level of the potential supplied to the back gate, a threshold voltage of the transistor 11 can be controlled. By providing the back gate, a channel formation region is enlarged and the drain current can be increased. Moreover, providing the back gate facilitates formation of a depletion layer in the semiconductor film, which results in lower subthreshold swing.

<Structure Example 2 of Switch Circuit>

Next, a specific structure example of the switch circuit 10 illustrated in FIG. 1 is described with reference to FIG. 2.

Figure 2:
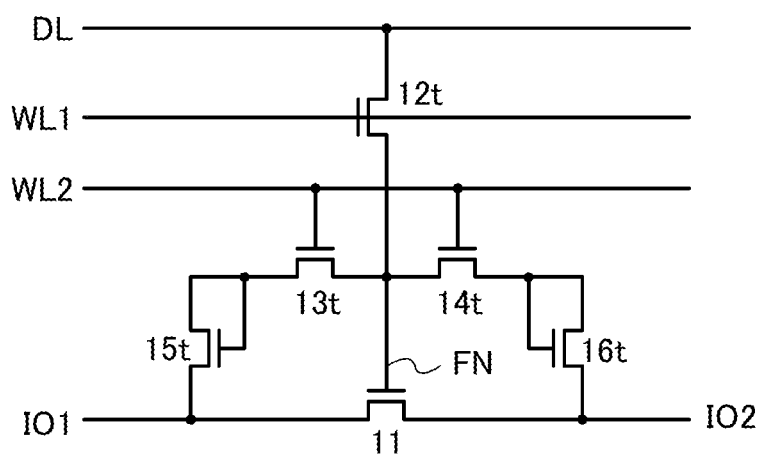
FIG. 2 illustrates a structure of a switch circuit.

The switch circuit 10 illustrated in FIG. 2 includes the transistor 11, transistors 12$t$, 13$t$, and 14$t$ functioning as the switches 12, 13, and 14 respectively, and transistors 15$t$ and 16$t$ functioning as the diodes 15 and 16 respectively.

A gate, one of a source and a drain, and the other of the source and the drain of the transistor 12$t$ are connected to the wiring WL1, the gate of the transistor 11, and the wiring DL, respectively.

A gate, one of a source and a drain, and the other of the source and the drain of the transistor 13$t$ are connected to the wiring WL2, a gate of the transistor 15$t$, and the gate of the transistor 11, respectively. One of a source and a drain and the other of the source and the drain of the transistor 15$t$ are connected to the wiring IO1 and the gate of the transistor 15$t$, respectively.

A gate, one of a source and a drain, and the other of the source and the drain of the transistor 14$t$ are connected to the wiring WL2, a gate of the transistor 16$t$, and the gate of the transistor 11, respectively. One of a source and a drain and the other of the source and the drain of the transistor 16$t$ are connected to the wiring IO2 and the gate of the transistor 16$t$, respectively.

Note that FIG. 2 illustrates a structure example of the switch circuit 10 in which the transistor 11 is of an n-channel type. In the case where the transistor 11 is of a p-channel type, one of the source and the drain of the transistor 15$t$ is connected to the gate of the transistor 15$t$ and the wiring I01. In addition, one of the source and the drain of the transistor 13$t$ is connected to the other of the source and the drain of the transistor 15$t$, and the other of the source and the drain of the transistor 13$t$ is connected to the gate of the transistor 11. Furthermore, one of the source and the drain of the transistor 16$t$ is connected to the gate of the transistor 16$t$ and the wiring IO2. One of the source and the drain of the transistor 14$t$ is connected to the other of the source and the drain of the transistor 16$t$, and the other of the source and the drain of the transistor 14$t$ is connected to the gate of the transistor 11.

Although the transistor 13$t$ is provided between the transistor 15$t$ and the gate of the transistor 11 in the structure example of the switch circuit 10 in FIG. 2, the transistor 15$t$ may be provided between the transistor 13$t$ and the gate of the transistor 11 in the switch circuit of one embodiment of the present invention. Similarly, although the transistor 14$t$ is provided between the transistor 16$t$ and the gate of the transistor 11 in the structure example of the switch circuit 10 in FIG. 2, the transistor 16$t$ may be provided between the transistor 14*t* and the gate of the transistor 11 in the switch circuit of one embodiment of the present invention.

FIG. 2 illustrates the case where all the transistors in the switch circuit 10 have a single-gate structure including one gate and one channel formation region. In the switch circuit of one embodiment of the present invention, any or all of the transistors in the switch circuit may have a multi-gate structure including a plurality of electrically connected gates and a plurality of channel formation regions.

In FIG. 2, the transistors in the switch circuit 10 have the gate on at least one side of a semiconductor film. The transistors may have a pair of gates with a semiconductor film positioned therebetween. When one of the pair of gates is regarded as a back gate, potentials at the same level may be supplied to a normal gate and the back gate, or a fixed potential such as a ground potential may be supplied only to the back gate. By controlling the level of the potential supplied to the back gate, the threshold voltage of the transistor can be controlled. By providing the back gate, a channel formation region is enlarged and the drain current can be increased. Moreover, providing the back gate facilitates formation of a depletion layer in the semiconductor film, which results in lower subthreshold swing.

Next, an operation example of the switch circuit 10 illustrated in FIG. 2 is described.

Figure 3A:
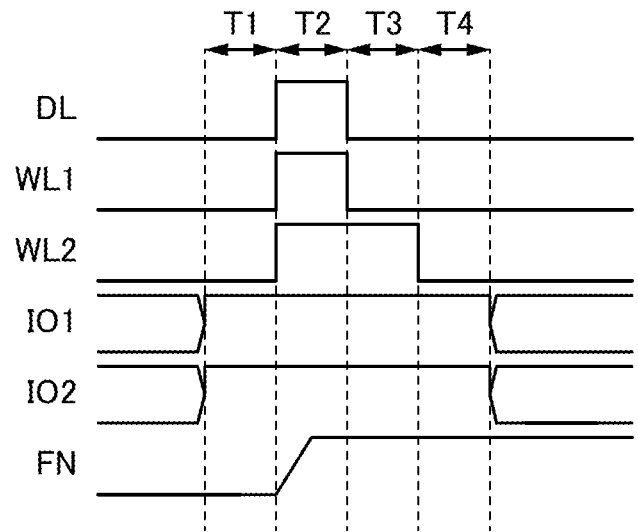
FIGS. 3A and 3B are timing charts.

First, an operation of the switch circuit 10 in the case of setting the electrical connection state of the switch circuit 10 to ON is described with reference to a timing chart of FIG. 3A. As shown in FIG. 3A, in a period T1, low-level potentials are supplied to the wiring DL, the wiring WL1, and the wiring WL2. High-level potentials are supplied to the wirings IO1 and IO2. Accordingly, the transistors 12*t* to 14*t* are all off in the period T1, which makes the node FN in a floating state. The timing chart of FIG. 3A shows an example in which the potential of the node FN in the period T1 is low.

Next, in a period T2, high-level potentials are supplied to the wiring DL, the wiring WL1, and the wiring WL2. High-level potentials are supplied to the wiring IO1 and the wiring IO2. Accordingly, the transistor 12*t* is turned on in the period T2, and the high-level potential is supplied from the wiring DL to the node FN through the transistor 12*t*. In addition, the transistors 13*t* and 14*t* are also turned on. Since the high-level potentials are supplied to the wirings IO1 and IO2, current does not flow through the transistors 15*t* and 16*t*. Thus, transfer of charges between the node FN and the wirings IO1 and IO2 does not occur, and the high-level potential is kept at the node FN.

Then, in a period T3, a low-level potential, a low-level potential, and a high-level potential are supplied to the wiring DL, the wiring WL1, and the wiring WL2, respectively. High-level potentials are supplied to the wirings IO1 and IO2. Accordingly, the transistor 12*t* is turned off in the period T3. In addition, the transistors 13*t* and 14*t* are on. Since the high-level potentials are supplied to the wirings IO1 and IO2, current does not flow through the transistors 15*t* and 16*t*. Thus, transfer of charges between the node FN and the wirings IO1 and IO2 does not occur, and the high-level potential is kept at the node FN.

Next, in a period T4, low-level potentials are supplied to the wiring DL, the wiring WL1, and the wiring WL2. A high-level potential is supplied to the wirings IO1 and IO2. Accordingly, the transistors 12*t* to 14*t* are off in the period T4, which makes the node FN in a floating state, so that the high-level potential is kept at the node FN.

By the above-described sequence of operation, a high-level potential can be written to the node FN; as a result, the electrical connection state of the switch circuit 10 can be set to ON.

Figure 3B:
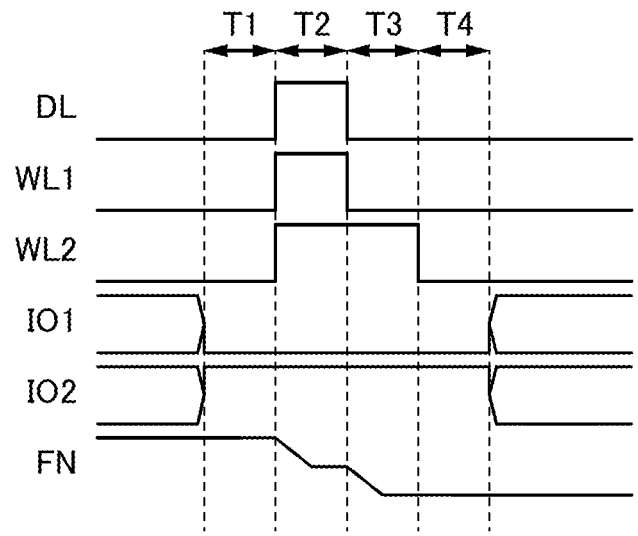

Next, an operation of the switch circuit 10 in the case of setting the electrical connection state of the switch circuit 10 to OFF is described with reference to a timing chart of FIG. 3B. As shown in FIG. 3B, in a period T1, low-level potentials are supplied to the wiring DL, the wiring WL1, and the wiring WL2. In addition, a low-level potential is supplied to the wiring IO1, and a high-level potential is supplied to the wiring IO2. Accordingly, all the transistors 12*t* to 14*t* are off in the period T1, which makes the node FN in a floating state. The timing chart of FIG. 3B shows an example in which the potential of the node FN is high in the period T1.

Next, in a period T2, high-level potentials are supplied to the wiring DL, the wiring WL1, and the wiring WL2. In addition, a low-level potential is supplied to the wiring IO1, and a high-level potential is supplied to the wiring IO2. Accordingly, the transistor 12*t* is turned on in the period T2, and the high-level potential is supplied from the wiring DL to the node FN through the transistor 12*t*. In addition, the transistors 13*t* and 14*t* are also turned on. Since the potential of the wiring IO2 is high, current does not flow through the transistor 16*t*. In contrast, since the potential of the wiring IO1 is low, a forward bias voltage is applied to the transistor 15*t*. Thus, charges transfer between the node FN and the wiring IO1, and the potential of the node FN decreases to a level that is between the high-level potential and the low-level potential.

Then, in a period T3, a low-level potential, a low-level potential, and a high-level potential are supplied to the wiring DL, the wiring WL1, and the wiring WL2, respectively. In addition, a low-level potential is supplied to the wiring IO1, and a high-level potential is supplied to the wiring IO2. Accordingly, the transistor 12*t* is turned off in the period T3. In addition, the transistors 13*t* and 14*t* are on. As in the period T2, since the potential of the wiring IO2 is high, current does not flow through the transistor 16*t*. In contrast, since the potential of the wiring IO1 is low, a forward bias voltage is applied to the transistor 15*t*. Thus, charges transfer between the node FN and the wiring IO1, and the potential of the node FN decreases to a low level.

Next, in a period T4, low-level potentials are supplied to the wiring DL, the wiring WL1, and the wiring WL2. In addition, a low-level potential is supplied to the wiring IO1, and a high-level potential is supplied to the wiring IO2. Accordingly, the transistors 12*t* to 14*t* are off in the period T4, which makes the node FN in a floating state, so that the low-level potential is kept at the node FN.

By the above-described sequence of operation, a low-level potential can be written to the node FN; as a result, the electrical connection state of the switch circuit 10 can be set to OFF. Although the timing chart of FIG. 3B shows an example in which the potentials of the wirings IO1 and IO2 are low and high, respectively, a low-level potential can be written to the node FN even when the potentials of the wirings IO1 and IO2 are high and low, respectively. Alternatively, even when the potentials of the wirings IO1 and IO2 are both low, a low-level potential can be written to the node FN.

Figure 17A:
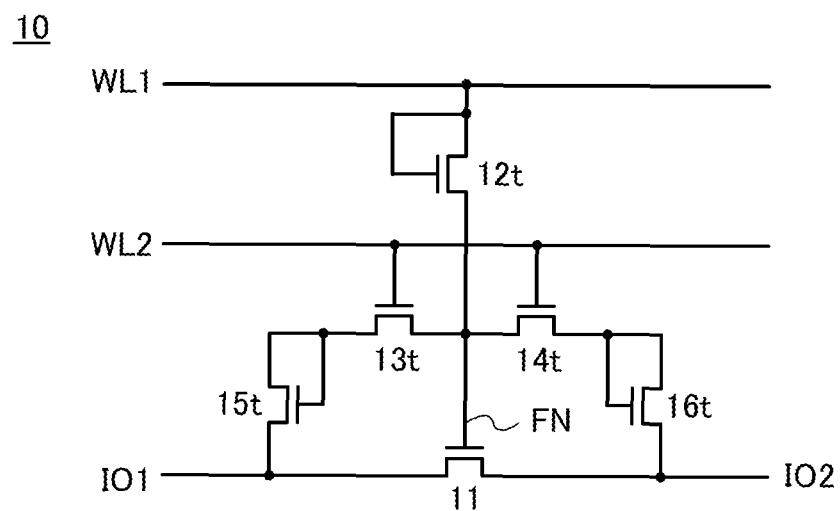
FIGS. 17A and 17B each illustrate a structure of a switch circuit.
Figure 17B:
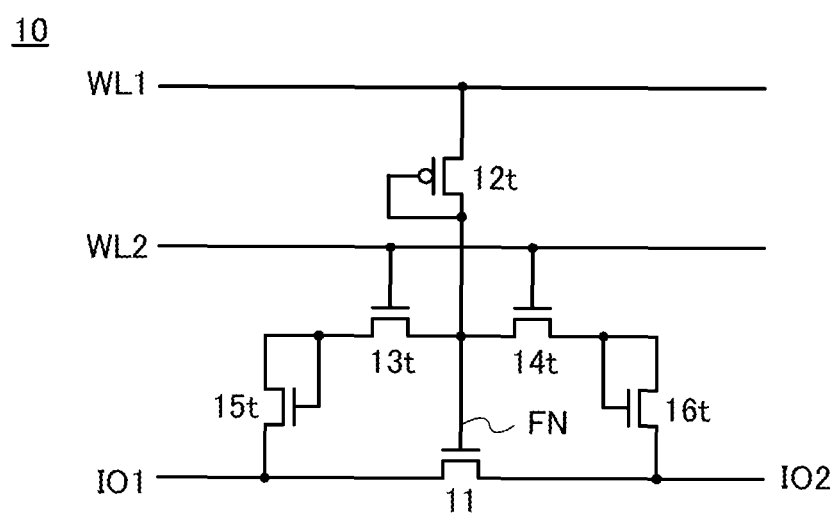

Note that the switch 12 may be formed using a diode. FIGS. 17A and 17B illustrate examples in which the switch 12 is formed using a diode-connected transistor.

The switch circuit 10 of one embodiment of the present invention can control the electrical connection state between the wiring IO1 and the wiring IO2 in accordance with the potential of the wiring IO1 or the wiring IO2. Thus, in the case where the wiring IO1 and the wiring IO2 are used for input/output of a signal between a plurality of components, the electrical connection state of the switch circuit 10 can be set by using the potential of a signal supplied from any of the plurality of components to the wiring IO1 or IO2. In other words, in one embodiment of the present invention, the electrical connection state of the switch circuit 10 can be controlled without additionally providing a circuit for controlling the electrical connection state of the switch circuit 10.

Furthermore, in one embodiment of the present invention, transistors with significantly low off-state current are used as the transistors 12t to 14t, whereby leakage of charges from the node FN can be prevented when the transistors 12t to 14t are off. As a result, the potential of the node FN can be kept for a long period. That is, in one embodiment of the present invention, the above-described structure can give the switch circuit 10 a function of a storage device. Thus, it is not necessary to additionally provide a storage device such as a register for keeping the electrical connection state of the switch circuit 10.

<Structure Example 3 of Switch Circuit>

FIGS. 3A and 3B each show a timing chart in the case of supplying a high-level potential to the wiring WL2 in the period T3 for setting the electrical connection state of the switch circuit 10 illustrated in FIG. 2. However, if the potential of the node FN is decreased to such a level as to make the transistor 11 off in the period T2 for setting the switch circuit 10 to OFF, it is not definitely necessary to supply a high-level potential to the wiring WL2 in the period T3. In the case where the potential of the node FN is in the level that makes the transistor 11 off in the period T2 for setting the switch circuit 10 to OFF, a low-level potential may be supplied to the wiring WL2 in the period T3 to turn off the transistors 13t and 14t.

With the above-described structure, the time for setting the electrical connection state of the switch circuit 10 to ON or OFF can be shortened, which is preferable.

Figure 4:
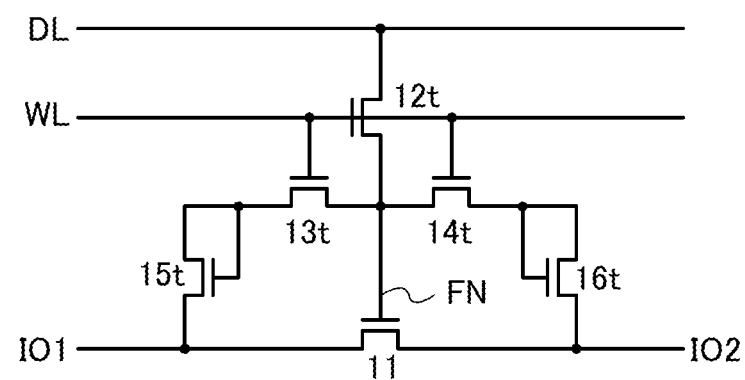
FIG. 4 illustrates a structure of a switch circuit.

In the case where the transistors 13t and 14t are turned off in the period T3, the wiring WL1 and the wiring WL2 may be electrically connected to each other. FIG. 4 illustrates a structure example of the switch circuit 10 in the case where the gates of the transistors 12t to 14t are connected to one wiring WL.

Figure 5:
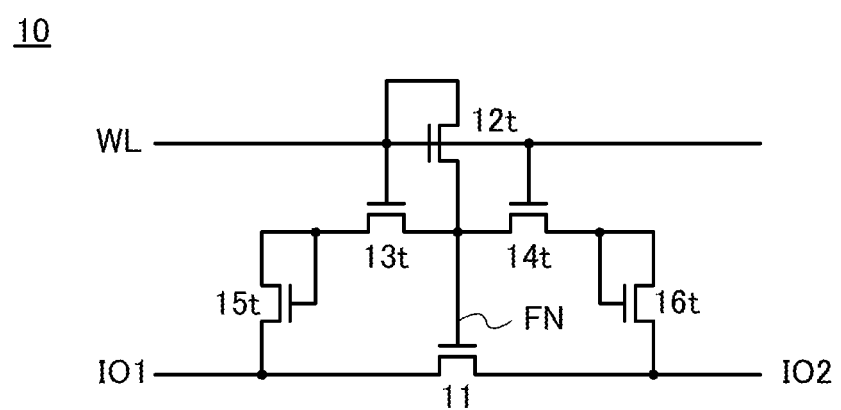
FIG. 5 illustrates a structure of a switch circuit.

In the case where the transistors 13t and 14t are turned off in the period T3, the wiring WL1, the wiring WL2, and the wiring DL may be electrically connected to one another. FIG. 5 illustrates a structure example of the switch circuit 10 in the case where the gates of the transistors 12t to 14t and the other of the source and the drain of the transistor 12t are connected to one wiring WL.

Figure 16:
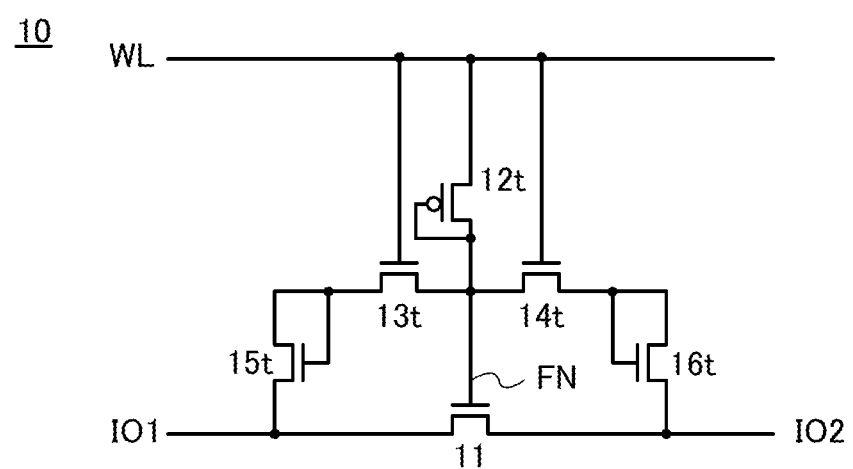
FIG. 16 illustrates a structure of a switch circuit.

Note that the transistor 12t may be of a p-channel type. An example of such a case is illustrated in FIG. 16.

<Structure Example 1 of Semiconductor Device and System>

The switch circuit of one embodiment of the present invention does not need a storage device such as a register for keeping the electrical connection state, and the electrical connection state can be controlled without providing a circuit for controlling the electrical connection state. Thus, in a semiconductor device or a system including a plurality of components, controlling the electrical connection state between the plurality of components with the switch circuit of one embodiment of the present invention can simplify the structure of the semiconductor device or system.

Figure 6:
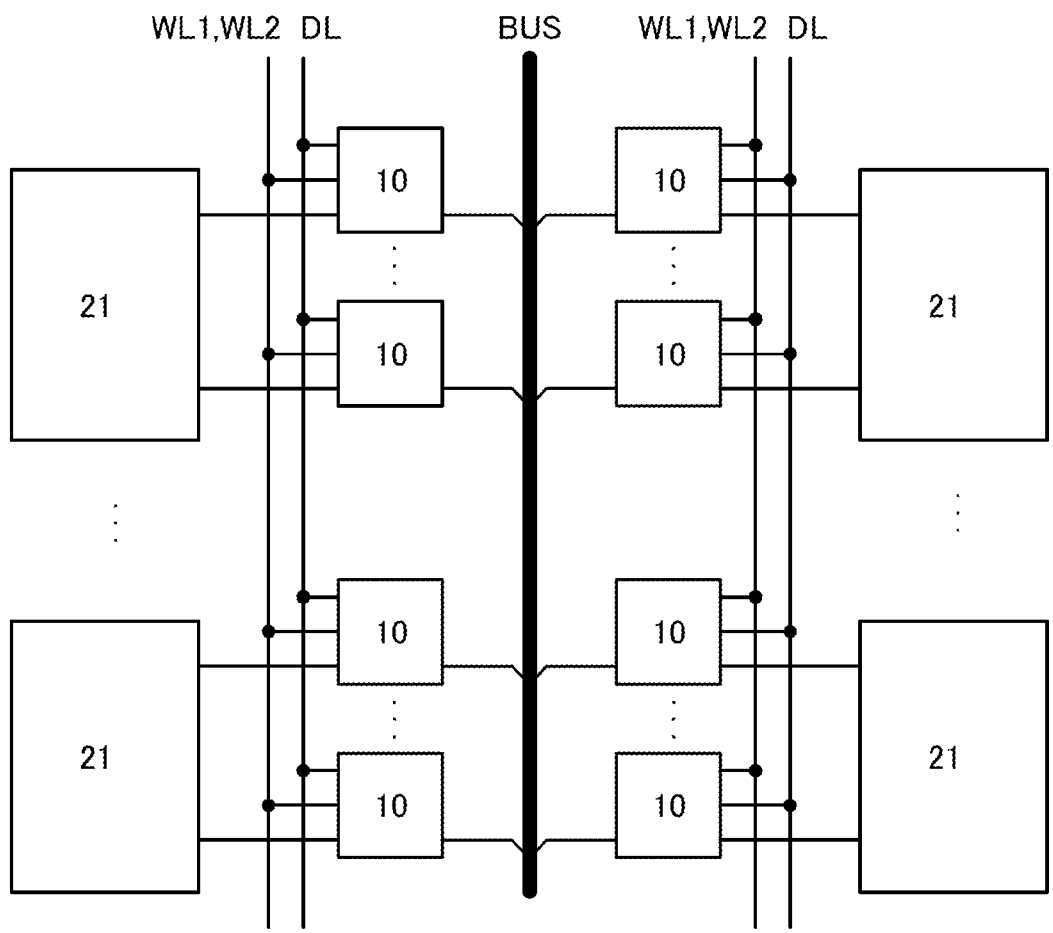
FIG. 6 illustrates a structure of a semiconductor device.

FIG. 6 is an example of a block diagram illustrating a structure of a semiconductor device 20 of one embodiment of the present invention. Although the block diagram attached to this specification shows components classified by their functions in independent blocks, it is difficult to classify actual components according to their functions completely and it is possible for one component to have a plurality of functions.

The semiconductor device 20 illustrated in FIG. 6 includes a plurality of components 21, a bus BUS that is a signal path connecting the plurality of components 21, and a plurality of switch circuits 10 that control the electrical connection states between the plurality of components 21 and the bus BUS.

In the structure example of the semiconductor device 20 in FIG. 6, there are a plurality of signal paths between each component 21 and the bus BUS, and each signal path is provided with the switch circuit 10.

Whether the plurality of switch circuits 10 set the electrical connection state is controlled by signals input to the wiring WL1, the wiring WL2, and the wiring DL. In the example of FIG. 6, the wiring WL1, the wiring WL2, and the wiring DL are connected to each switch circuit 10 like the switch circuit 10 illustrated in FIG. 1 or FIG. 2. Note that in the semiconductor device of one embodiment of the present invention, the wiring WL and the wiring DL may be connected to the switch circuit 10 like the switch circuit 10 illustrated in FIG. 4, or the wiring WL may be connected to the switch circuit 10 like the switch circuit 10 illustrated in FIG. 5.

Either one of the wirings IO1 and IO2 connected to the switch circuit 10 is connected to the component 21, and the other is connected to the bus BUS. For example, at the time of setting the electrical connection state in the switch circuit 10, the electrical connection state of the switch circuit 10 can be set to OFF by setting the potential supplied from the component 21 to the wiring IO1 or IO2 low. Thus, the signal path between the component 21 and the bus BUS through the switch circuit 10 in the OFF state is blocked.

For example, at the time of setting the electrical connection state in the switch circuits 10, the electrical connection state of all the switch circuits 10 having the wiring IO1 or IO2 connected to the bus BUS can be set to OFF all at once by setting the potential supplied from the bus BUS to the wiring IO1 or IO2 low.

As the components 21 included in the semiconductor device 20, a variety of circuits or devices that perform input or output of signals can be used. For example, in the case where the semiconductor device 20 is a hardware of a Neumann personal computer, an arithmetic device, a control device, a buffer memory device, a master storage, an input-output device, or the like can be used as the components 21. In the case where the semiconductor device 20 is an arithmetic device, a variety of logic circuits for forming an arithmetic device can be used as the components 21.

As the components included in the system, in addition to a variety of circuits or devices that perform input or output of signals, a variety of electronic devices such as a computer, a detector, a television set, a printer, and a communication device can be used. Note that examples of the computer include a variety of digital computers such as a tablet personal computer, a notebook personal computer, a desktop personal computer, a large-sized computer (e.g., a server system), and a supercomputer.

As examples of the system of one embodiment of the present invention, there are a communication system and a computer system. Furthermore, the system of one embodiment of the present invention can be used for a social infrastructure such as a railroad, a harbor, or a road, housing, and the like.

FIG. 6 illustrates the example in which signal transmission and reception is performed between the components 21 and a device that is outside the semiconductor device 20 through the bus BUS and the potential supplied from the bus BUS to the wiring IO1 or IO2 is controlled by the outside device. Next, FIG. 7 illustrates a structure example of the semiconductor device 20 which is provided with a component 22 that transfers and receives signals to/from the components 21 through the bus BUS and that can control the potential supplied from the bus BUS to the wiring IO1 or IO2.

Figure 7:
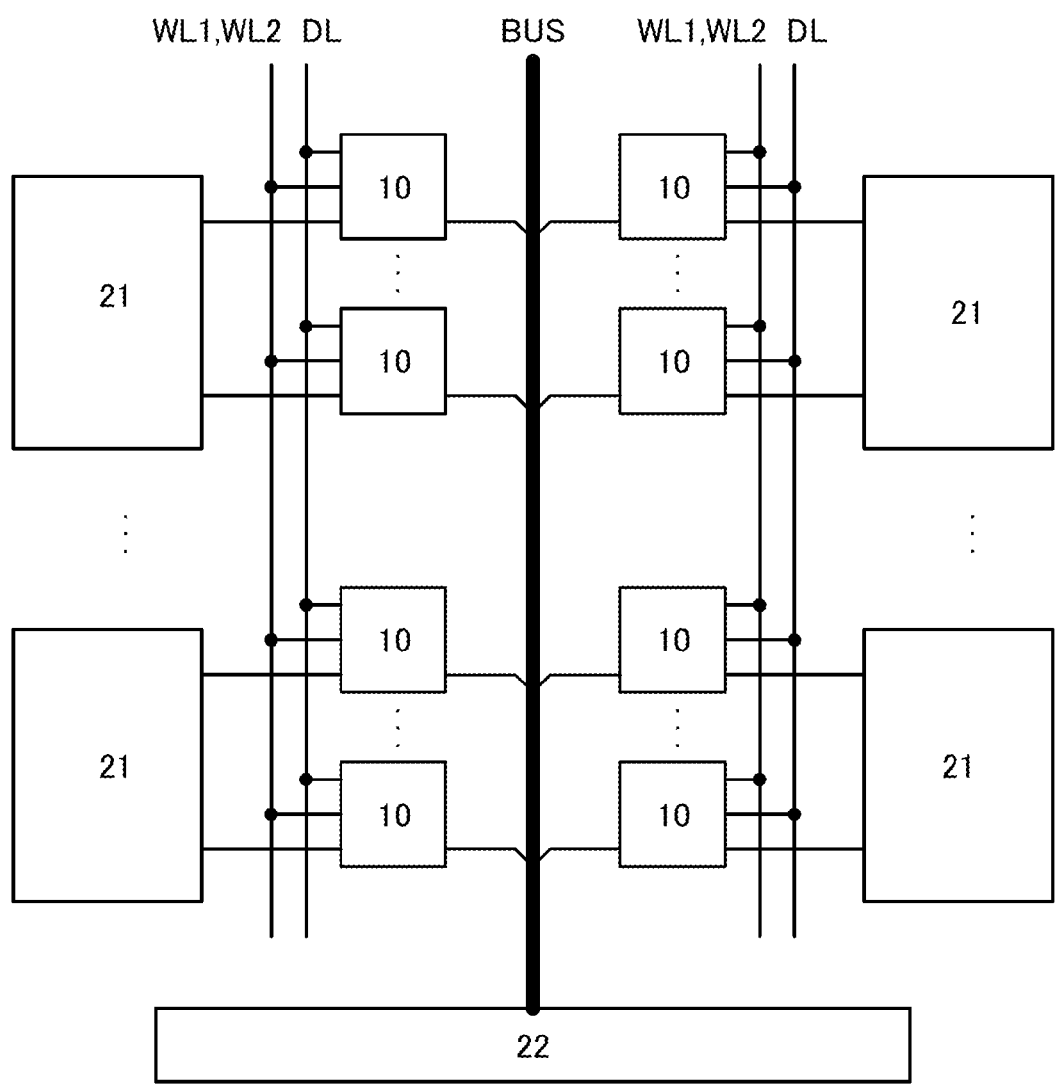
FIG. 7 illustrates a structure of a semiconductor device.

In the semiconductor device 20 illustrated in FIG. 7, at the time of setting the electrical connection state in the switch circuits 10, by setting the potential supplied from the bus BUS to the wiring IO1 or IO2 low by the component 22, the electrical connection state of all the switch circuits 10 having the wiring IO1 or IO2 connected to the bus BUS can be set to OFF all at once.

The electrical connection state of all the switch circuits 10 can be determined according to an instruction input from the outside device of the semiconductor device 20. Alternatively, the operation state of each component 21 is monitored by the component 22, and the electrical connection state of all the switch circuits 10 can be determined on the basis of the monitoring results by the component 22. Alternatively, any one of the plurality of components 21 or the plurality of components 21 monitor the operation state of other components 21, and the electrical connection state of all the switch circuits 10 is determined on the basis of the monitoring results by the monitoring one or plurality of components 21, and an instruction to set the electrical connection state of the switch circuits 10 to ON or OFF can be transmitted to the component 22. Further alternatively, the plurality of components 21 monitor each other's operation states, the electrical connection state of all the switch circuits 10 is determined on the basis of the monitoring results by any of the plurality of components 21, and an instruction to set the electrical connection state of the switch circuits 10 to ON or OFF can be transmitted to the component 22.

<Specific Structure Example 1 of Semiconductor Device>

Next, a specific structure example of the semiconductor device of one embodiment of the present invention is described with reference to FIG. 8.

Figure 8:
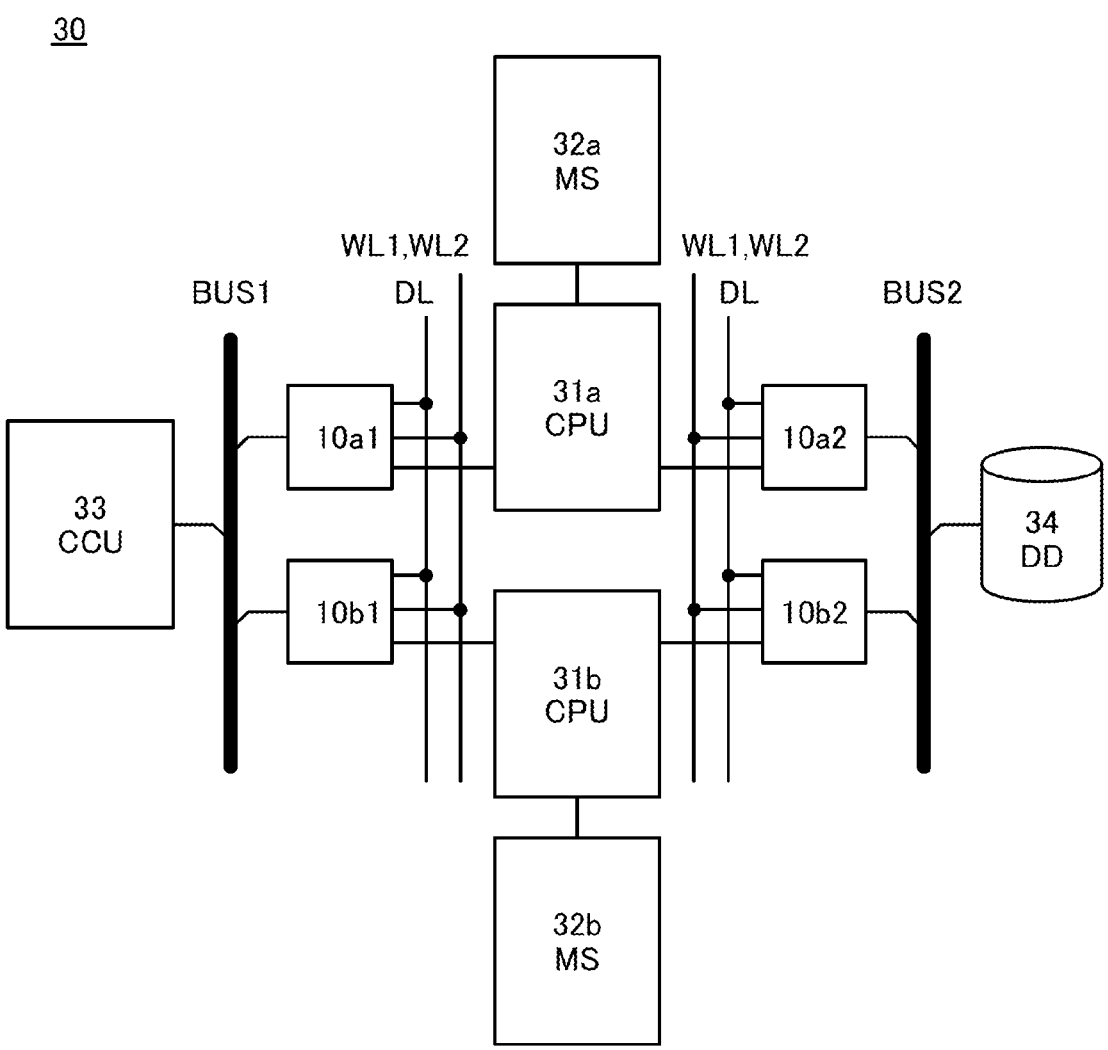
FIG. 8 illustrates a structure of a semiconductor device.

A semiconductor device 30 illustrated in FIG. 8 has a redundant configuration in which a duplex system is employed. Specifically, the semiconductor device 30 illustrated in FIG. 8 includes a CPU 31a and a CPU 31b that serve as a central processing unit, an MS 32a and an MS 32b that serve as a master storage, a CCU 33 that serves as a communication control unit, and a DD 34 that serves as a disk device.

The CPU 31a has a function of executing an instruction by controlling operations of the MS 32a, the CCU 33, and the DD 34 collectively. The CPU 31b has a function of executing an instruction by collectively controlling operations of the MS 32b, the CCU 33, and the DD 34. The CCU 33 has a function of controlling data transmission and reception between a communication line and the CPU 31a or 31b. The MS 32a has a function of storing a variety of data and programs used in the CPU 31a. The MS 32b has a function of storing a variety of data and programs used in the CPU 31b. The DD 34 has a function of storing a variety of data and programs used in the CPU 31a or 31b. As the DD 34, an outside storage device such as a hard disk or a flash memory can be used, for example.

In the semiconductor device 30 illustrated in FIG. 8, the CPUs 31a and 31b, the MSs 32a and 32b, the CCU 33, and the DD 34 serve as components. The semiconductor device 30 illustrated in FIG. 8 includes a bus BUS1 and a bus BUS2 which are signal paths connecting the above-described plurality of components, a switch circuit 10a1, a switch circuit 10a2, a switch circuit 10b1, and a switch circuit 10b2.

Specifically, in FIG. 8, the bus BUS1 is the signal path connecting the CCU 33 and the CPU 31a, and the switch circuit 10a1 has a function of controlling the electrical connection state between the bus BUS1 and the CPU 31a. In addition, the bus BUS1 is the signal path connecting the CCU 33 and the CPU 31b, and the switch circuit 10b1 has a function of controlling the electrical connection state between the bus BUS1 and the CPU 31b.

The bus BUS2 is the signal path connecting the CPU 31a and the DD 34, and the switch circuit 10a2 has a function of controlling the electrical connection state between the bus BUS2 and the CPU 31a. In addition, the bus BUS2 is the signal path connecting the CPU 31b and the DD 34, and the switch circuit 10b2 has a function of controlling the electrical connection state between the bus BUS2 and the CPU 31b.

Whether the switch circuit 10a1, the switch circuit 10a2, the switch circuit 10b1, and the switch circuit 10b2 each set the electrical connection state is controlled by signals input to the wiring WL1, the wiring WL2, and the wiring DL. Although FIG. 8 illustrates the switch circuits to which the wiring WL1, the wiring WL2, and the wiring DL are connected like the switch circuit 10 illustrated in FIG. 1 or FIG. 2, in a semiconductor device of one embodiment of the present invention, the wiring WL and the wiring DL may be connected to each of the switch circuits like the switch circuit 10 illustrated in FIG. 4, or the wiring WL may be connected to each of the switch circuits like the switch circuit 10 illustrated in FIG. 5.

FIG. 8 illustrates the example in which the switch circuit 10a1, the switch circuit 10a2, the switch circuit 10b1, and the switch circuit 10b2 share wirings for controlling whether to set the electrical connection state, such as the wiring WL1, the wiring WL2, and the wiring DL. However, in the semiconductor device of one embodiment of the present invention, any one of or some of the switch circuit 10a1, the switch circuit 10a2, the switch circuit 10b1, and the switch circuit 10b2 may be connected to wirings for controlling whether to set the electrical connection state, which are different from the wirings the other switch circuits are connected to.

In the semiconductor device 30 illustrated in FIG. 8, the CPU 31a and the MS 32a serve as components of a main system, and the CPU 31b and the MS 32b serve as components of a waiting system. In normal operation, the CPU 31a and the MS 32a of the main system perform a variety of processing together with the CCU 33 and the DD 34. When a trouble occurs in the CPU 31a or the MS 32a, the CPU 31b and the MS 32b of the waiting system perform a variety of processing instead of the CPU 31a and the MS 32a, together with the CCU 33 and the DD 34. Switching between the components of the main system and the components of the waiting system can be performed by changing the setting of the electrical connection state of the switch circuit 10a1, the switch circuit 10a2, the switch circuit 10b1, and the switch circuit 10b2.

For example, in the case where a hot standby duplex system is employed in the semiconductor device 30, the components of the main system perform processing in normal operation. The components of the waiting system perform processing similar to that of the components of the main system, in a standby state. Thus, in normal operation, the electrical connection state of all the switch circuits 10a1, 10a2, 10b1, and 10b2 is set to ON. When a trouble occurs in the components of the main system, the processing the components of the main system have performed is taken over by the components of the waiting system. After the components of the waiting system take over the processing, the signal path between the components of the main system and the CCU 33 and that between the components of the main system and the DD 34 are blocked by turning off the switch circuit 10a1 and the switch circuit 10a2.

For example, in the case where a warm standby duplex system is employed in the semiconductor device 30, the components of the main system perform processing in normal operation. The components of the waiting system do not perform processing in a standby state unlike the hot standby duplex system although power is supplied and an operating system (OS) is running. For this reason, in normal operation, the electrical connection state of all of the switch circuits 10a1, 10a2, 10b 1, and 10b2 may be set to ON, or alternatively, the electrical connection state of the switch circuits 10b1 and 10b2 may be set to OFF while the electrical connection state of the switch circuits 10a1 and 10a2 is set to ON. When a trouble occurs in the components of the main system, after an application necessary to take over processing starts up, the components of the waiting system take over the processing that the components of the main system have performed. In the case where the switch circuits 10b 1 and 10b2 are set to OFF in normal operation, before starting up the application, the switch circuits 10b1 and 10b2 are set to ON. After the processing is taken over by the components of the waiting system, the signal path between the components of the main system and the CCU 33 and that between the components of the main system and the DD 34 are blocked by turning off the switch circuits 10a1 and 10a2.

For example, in the case where a cold standby duplex system is employed in the semiconductor device 30, the components of the main system perform processing in normal operation. The components of the waiting system are powered off or in a state in which power is supplied but an operating system (OS) is not running. For this reason, in normal operation, the electrical connection state of the switch circuits 10a1 and 10a2 is set to ON and the electrical connection state of the switch circuits 10b1 and 10b2 is set to OFF. When a trouble occurs in the components of the main system, the components of the waiting system are powered on if not powered in normal operation, and run the operating system, and an application necessary to take over processing starts up, so that the processing that the components of the main system have performed is taken over. The electrical connection state of the switch circuits 10b1 and 10b2 is set to ON before starting up the application. After the processing is taken over by the components of the waiting system, the signal path between the components of the main system and the CCU 33 and that between the components of the main system and the DD 34 are blocked by turning off the switch circuits 10a1 and 10a2.

<Specific Structure Example 2 of Semiconductor Device>

Next, a specific structure example of the semiconductor device of one embodiment of the present invention, which is different from that in FIG. 8, is described with reference to FIG. 9.

Figure 9:
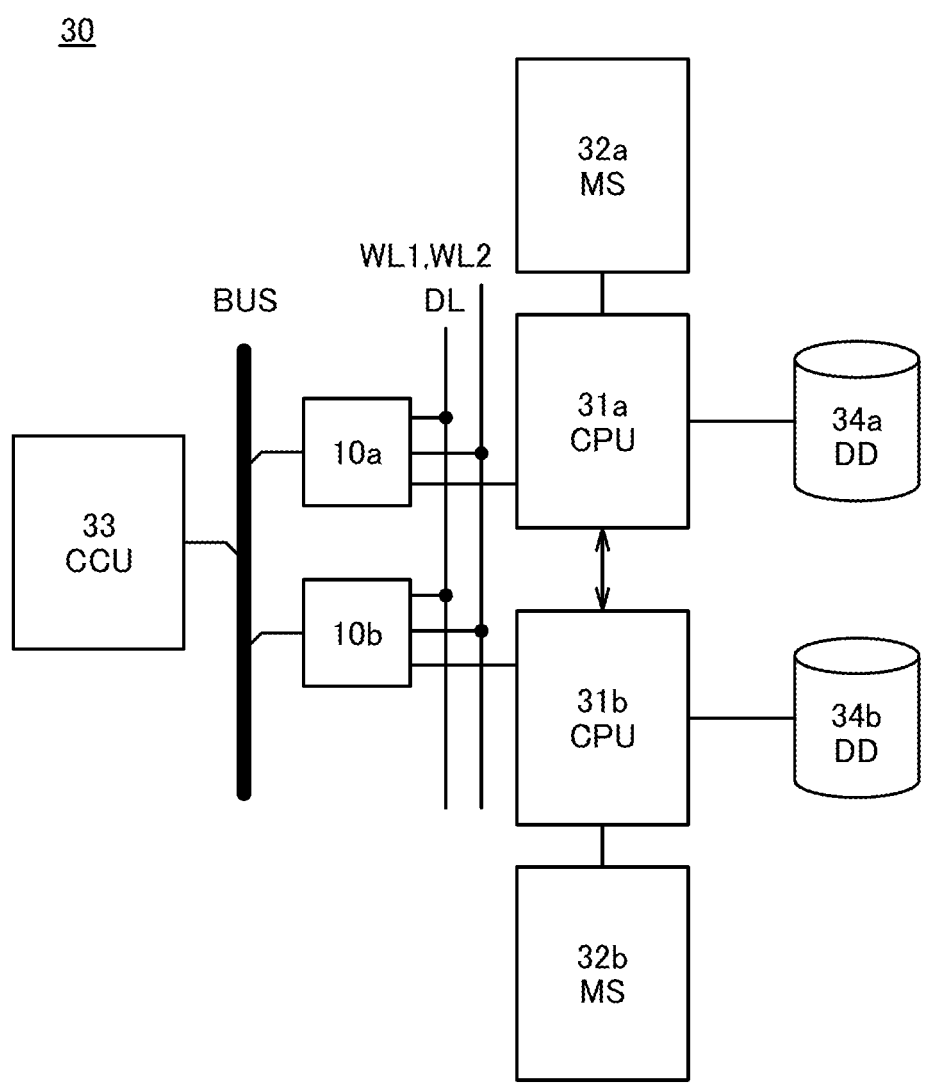
FIG. 9 illustrates a structure of a semiconductor device.

The semiconductor device 30 illustrated in FIG. 9 has a redundant configuration in which a dual system is employed. Specifically, the semiconductor device 30 illustrated in FIG. 9 includes the CPUs 31a and 31b, the MSs 32a and 32b, the CCU 33, and DDs 34a and 34b.

The CPU 31a has a function of executing an instruction by collectively controlling operations of the MS 32a, the CCU 33, and the DD 34a. The CPU 31b has a function of executing an instruction by controlling operations of the MS 32b, the CCU 33, and the DD 34b collectively. The CCU 33 has a function of controlling data transmission and reception between a communication line and the CPU 31a or 31b. The MS 32a has a function of storing a variety of data and programs used in the CPU 31a. The MS 32b has a function of storing a variety of data and programs used in the CPU 31b. The DD 34a has a function of storing a variety of data and programs used in the CPU 31a. The DD 34b has a function of storing a variety of data and programs used in the CPU 31b.

In the semiconductor device 30 illustrated in FIG. 9, the CPUs 31a and 31b, the MSs 32a and 32b, the CCU 33, and the DDs 34a and 34b serve as components. The semiconductor device 30 illustrated in FIG. 9 includes a bus BUS which is a signal path connecting the above-described plurality of components, a switch circuit 10a, and a switch circuit 10b.

Specifically, in FIG. 9, the bus BUS is the signal path connecting the CCU 33 and the CPU 31a, and the switch circuit 10a has a function of controlling the electrical connection state between the bus BUS and the CPU 31a. In addition, the bus BUS is the signal path connecting the CCU 33 and the CPU 31b, and the switch circuit 10b has a function of controlling the electrical connection state between the bus BUS and the CPU 31b.

In the semiconductor device 30 illustrated in FIG. 9, in normal operation, a processing system consisting of the CPU 31a, the MS 32a, and the DD 34a and a processing system consisting of the CPU 31b, the MS 32b, and the DD 34b perform the same processing. The processing systems check each other's processing results so that occurrence of a trouble can be found in the semiconductor device 30. For this reason, in normal operation, the electrical connection state of all of the switch circuits 10a and 10b is set to ON. After checking, when a trouble in one of the processing systems is found, the electrical connection state of the switch circuit 10a or 10b is set so that the signal path between the processing system where the trouble has occurred and the CCU 33 is blocked.

<Specific Structure Example 3 of Semiconductor Device>

Next, a specific structure example of the semiconductor device of one embodiment of the present invention, which is different from those in FIG. 8 and FIG. 9, is described with reference to FIG. 10.

Figure 10:
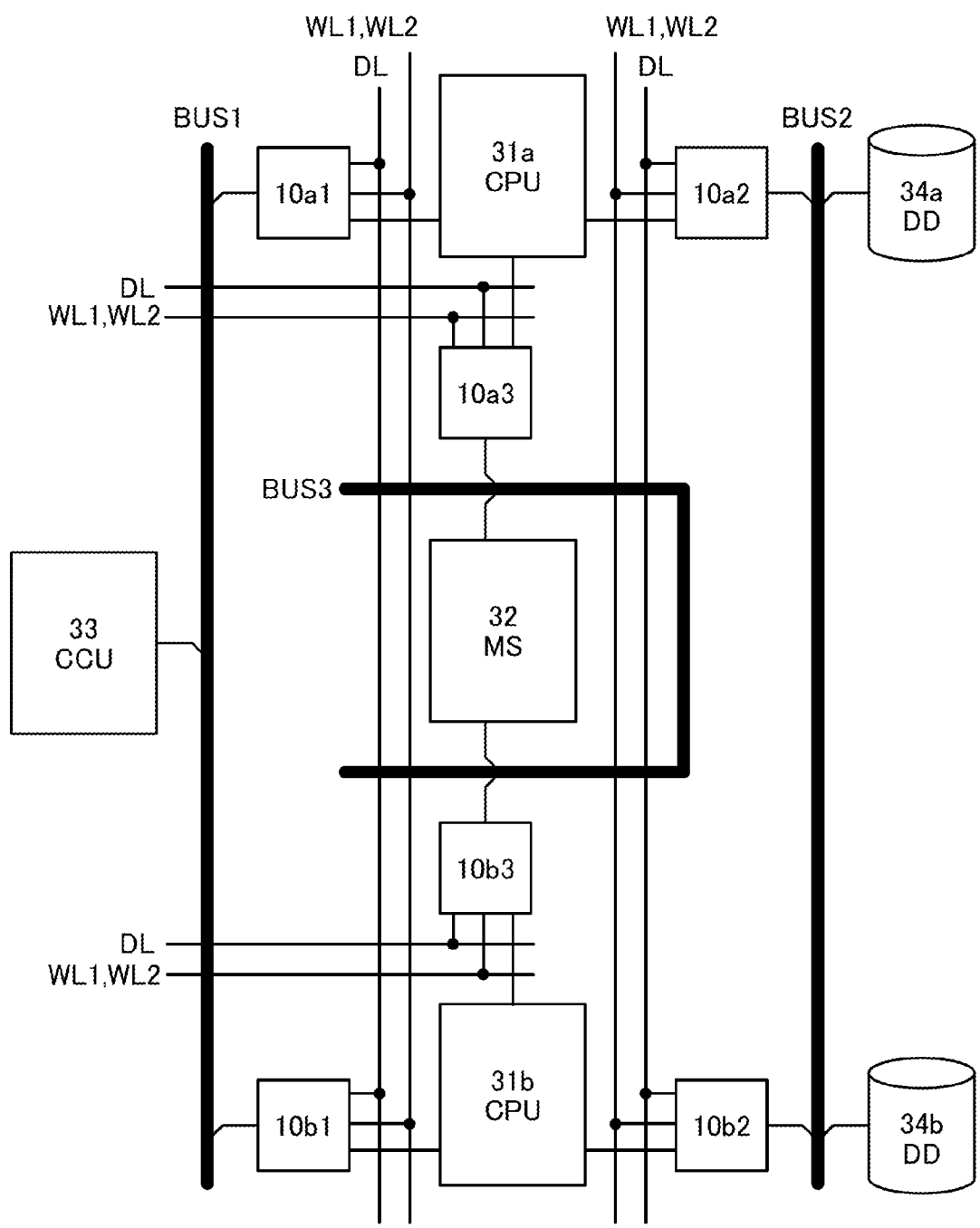
FIG. 10 illustrates a structure of a semiconductor device.

The semiconductor device 30 illustrated in FIG. 10 has a structure in which a shared-memory multiprocessor system is used. Specifically, the semiconductor device 30 illustrated in FIG. 10 includes the CPUs 31a and 31b an MS 32, the CCU 33, and the DDs 34a and 34b.

The CPU 31a has a function of executing an instruction by collectively controlling operations of the MS 32, the CCU 33, and the DDs 34a and 34b. The CPU 31b has a function of executing an instruction by controlling operations of the MS 32, the CCU 33, and the DDs 34a and 34b collectively. The CCU 33 has a function of controlling data transmission and reception between a communication line and the CPU 31a or 31b. The MS 32 has a function of storing a variety of data and programs used in the CPUs 31a and 31*b*. The DDs 34*a* and 34*b* have a function of storing a variety of data and programs used in the CPUs 31*a* and 31*b*.

In the semiconductor device 30 illustrated in FIG. 10, the CPUs 31*a* and 31*b*, the MS 32, the CCU 33, and the DDs 34*a* and 34*b* serve as components. The semiconductor device 30 illustrated in FIG. 10 includes buses BUS1, BUS2, and BUS3 which are signal paths connecting the above-described plurality of components, switch circuits 10*a*1, 10*a*2, and 10*a*3, and switch circuits 10*b*1, 10*b*2, and 10*b*3.

Specifically, in FIG. 10, the bus BUS1 is the signal path connecting the CCU 33 and the CPU 31*a*, and the switch circuit 10*a*1 has a function of controlling the electrical connection state between the bus BUS1 and the CPU 31*a*. In addition, the bus BUS1 is the signal path connecting the CCU 33 and the CPU 31*b*, and the switch circuit 10*b*1 has a function of controlling the electrical connection state between the bus BUS1 and the CPU 31*b*.

In FIG. 10, the bus BUS2 is the signal path connecting the CPU 31*a* and the DD 34*a* or 34*b*. The switch circuit 10*a*2 has a function of controlling the electrical connection state between the bus BUS2 and the CPU 31*a*. In addition, the bus BUS2 is the signal path connecting the CPU 31*b* and the DD 34*a* or 34*b*. The switch circuit 10*b*2 has a function of controlling the electrical connection state between the bus BUS2 and the CPU 31*b*.

In FIG. 10, the bus BUS3 is the signal path connecting the CPU 31*a* or 31*b* and the MS 32. The switch circuit 10*a*3 has a function of controlling the electrical connection state between the bus BUS3 and the CPU 31*a*. The switch circuit 10*b*3 has a function of controlling the electrical connection state between the bus BUS3 and the CPU 31*b*.

In the semiconductor device 30 illustrated in FIG. 10, in normal operation, the CPUs 31*a* and 31*b* share the MS 32 and the DDs 34*a* and 34*b* and divide the processing task. For this reason, in normal operation, the electrical connection state of the switch circuits 10*a*1 to 10*a*3 and the electrical connection state of the switch circuits 10*b*1 to 10*b*3 are all set to ON. Then, when a trouble in one of the CPUs 31*a* and 31*b* is found, the signal paths connecting the CPU where the trouble has occurred to the CCU 33, the MS 32, and the DDs 34*a* and 34*b* are blocked. For example, when a trouble occurs in the CPU 31*a*, the electrical connection state of the switch circuits 10*a*1 to 10*a*3 is set to OFF. When a trouble occurs in the CPU 31*b*, the electrical connection state of the switch circuits 10*b*1 to 10*b*3 is set to OFF.

<Example of Cross-Sectional Structure of Semiconductor Device>

Figure 11:
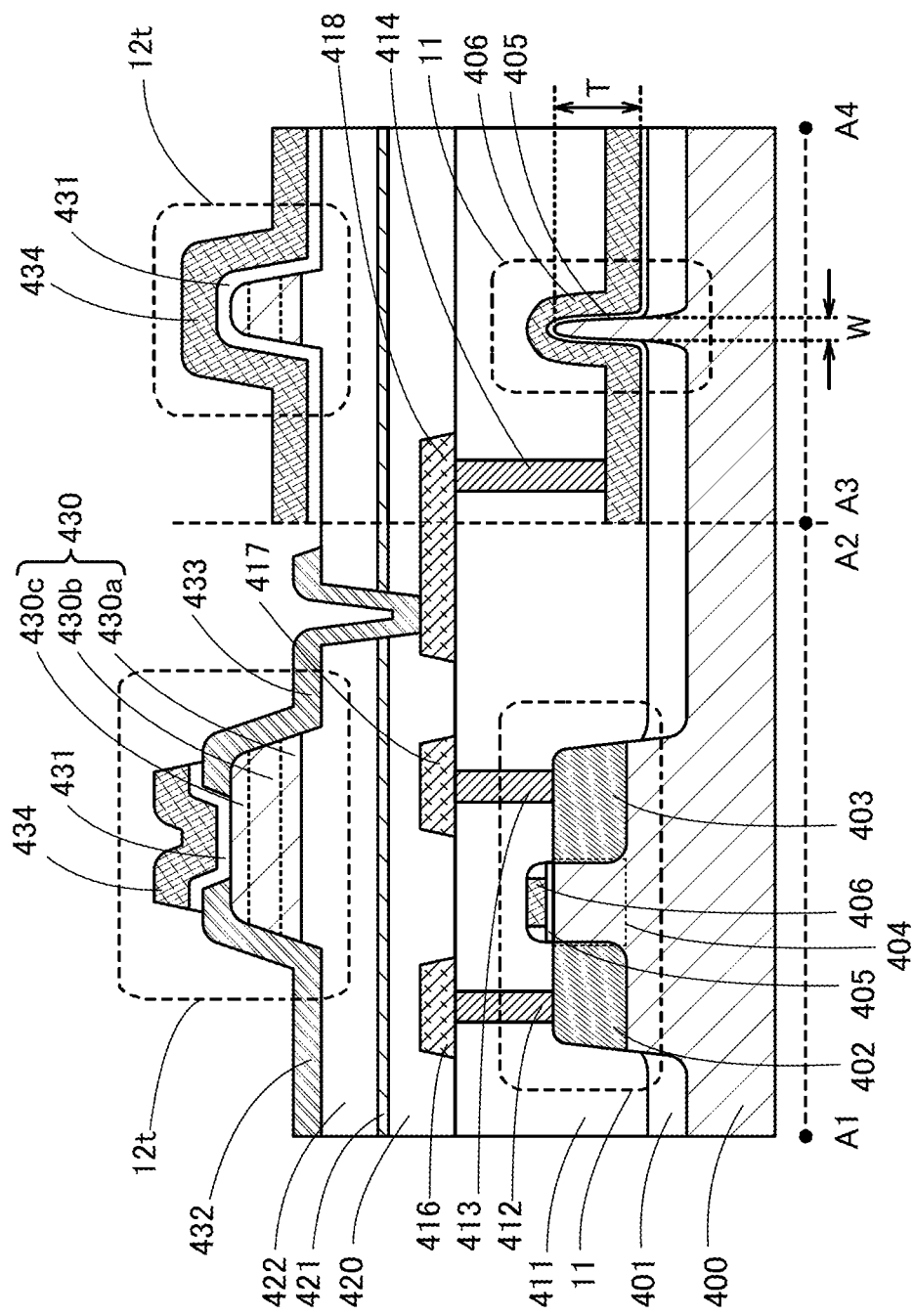
FIG. 11 illustrates a cross-sectional structure of a semiconductor device.

FIG. 11 illustrates an example of a cross-sectional structure of the transistor 11 and the transistor 12*t* included in the switch circuit 10 illustrated in FIG. 2. A region along dashed line A1-A2 shows a structure of the transistors 11 and 12*t* in the channel length direction, and a region along dashed line A3-A4 shows a structure of the transistors 11 and 12*t* in the channel width direction. Note that in one embodiment of the present invention, the channel length direction of the transistor 11 is not necessarily the same as the channel length direction of the transistor 12*t*.

The channel length direction refers to a direction in which a carrier moves between a pair of impurity regions functioning as a source region and a drain region by the most direct way, and the channel width direction refers to a direction perpendicular to the channel length direction.

In FIG. 11, the transistor 12*t* including a channel formation region in an oxide semiconductor film is formed over the transistor 11 including a channel formation region in a single crystal silicon substrate.

The transistor 11 may include the channel formation region in a semiconductor film or a semiconductor substrate of silicon, germanium, or the like in an amorphous, microcrystalline, polycrystalline, or single crystal state. Alternatively, the transistor 11 may include the channel formation region in an oxide semiconductor film or an oxide semiconductor substrate. In the case where channel formation regions of all the transistors are included in an oxide semiconductor film or an oxide semiconductor substrate, the transistor 12*t* is not necessarily stacked over the transistor 11, and the transistors 12*t* and 11 may be formed in the same layer.

In the case where the transistor 11 is formed using a thin silicon film, any of the following can be used in the thin film: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

A semiconductor substrate 400 where the transistor 11 is formed can be, for example, a silicon substrate, a germanium substrate, or a silicon germanium substrate. In FIG. 11, a single crystal silicon substrate is used as the substrate 400.

The transistor 11 is electrically isolated by an element isolation method. As the element isolation method, a trench isolation method (a shallow trench isolation (STI) method) or the like can be used. FIG. 11 illustrates an example where the trench isolation method is used to electrically isolate the transistor 11. Specifically, in FIG. 11, the transistor 11 is electrically isolated by element isolation using an element isolation region 401 formed in such a manner that an insulator including silicon oxide or the like is buried in a trench formed in the substrate 400 by etching or the like and then the insulator is removed partly by etching or the like.

In a projection of the substrate 400 that exists in a region other than the trench, an impurity region 402 and an impurity region 403 of the transistor 11 and a channel formation region 404 placed between the impurity regions 402 and 403 are provided. Further, the transistor 11 includes an insulating film 405 covering the channel formation region 404 and a gate electrode 406 that overlaps the channel formation region 404 with the insulating film 405 provided therebetween.

In the transistor 11, a side portion and an upper portion of the projection in the channel formation region 404 overlap with the gate electrode 406 with the insulating film 405 positioned therebetween, so that carriers flow in a wide area (including the side portion and the upper portion of the channel formation region 404). Therefore, an area over the substrate occupied by the transistor 11 can be reduced, and the number of transferred carriers in the transistor 11 can be increased. As a result, the on-state current and field-effect mobility of the transistor 11 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 11 can be further increased and the field-effect mobility of the transistor 11 can be further increased.

Note that when the transistor 11 is formed using a bulk semiconductor substrate, the aspect ratio is preferably 0.5 or more, further preferably 1 or more.

An insulating film 411 is provided over the transistor 11. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

An insulating film 420 is provided over the conductive films 416 to 418. An insulating film 421 having a blocking effect of preventing diffusion of oxygen, hydrogen, and water is provided over the insulating film 420. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 12t is provided over the insulating film 422.

The transistor 12t includes, over the insulating film 422, a semiconductor film 430 including an oxide semiconductor, conductive films 432 and 433 functioning as a source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween. Note that an opening is formed in the insulating films 420 to 422. The conductive film 433 is connected to the conductive film 418 in the opening.

Note that in FIG. 11, the transistor 12t includes at least the gate electrode 434 on one side of the semiconductor film 430, and may further include a gate electrode overlapping with the semiconductor film 430 with the insulating film 422 positioned therebetween.

In the case where the transistor 12t has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 11, the transistor 12t has a single-gate structure where one channel formation region corresponding to one gate electrode 434 is provided. However, the transistor 12t may have a multi-gate structure where a plurality of electrically connected gate electrodes are provided so that a plurality of channel formation regions are included in one active layer.

FIG. 11 illustrates an example in which the semiconductor film 430 included in the transistor 12t includes oxide semiconductor films 430a to 430c that are stacked in this order over the insulating film 422. Note that in one embodiment of the present invention, the semiconductor film 430 of the transistor 12t may be formed using a single-layer metal oxide film.

In the case where the transistor 12t includes the semiconductor film 430 consisting of the semiconductor films 430a to 430c stacked in this order, each of the oxide semiconductor films 430a and 430c is an oxide film that contains at least one of metal elements contained in the oxide semiconductor film 430b and in which energy at the conduction band minimum is closer to the vacuum level than that in the oxide semiconductor film 430b is by higher than or equal to 0.05 eV, 0.07 eV, 0.1 eV, or 0.15 eV and lower than or equal to 2 eV, 1 eV, 0.5 eV, or 0.4 eV The oxide semiconductor film 430b preferably contains at least indium because carrier mobility is increased.

In the case where the transistor 12t includes the semiconductor films with the above structure, when an electric field is applied to the semiconductor films by applying voltage to the gate electrode 434, a channel region is formed in the oxide semiconductor film 430b, which has the lowest conduction band minimum among the semiconductor films. That is, since the oxide semiconductor film 430c is provided between the oxide semiconductor film 430b and the gate insulating film 431, a channel region can be formed in the oxide semiconductor film 430b, which is separated from the gate insulating film 431.

Since the oxide semiconductor film 430c contains at least one of metal elements contained in the oxide semiconductor film 430b, interface scattering is unlikely to occur at the interface between the oxide semiconductor film 430b and the oxide semiconductor film 430c. Thus, the movement of carriers is unlikely to be inhibited at the interface, which results in an increase in the field-effect mobility of the transistor 12t.

When an interface state is formed at an interface between the oxide semiconductor films 430b and 430a, a channel region is also formed in a region close to the interface; thus, the threshold voltage of the transistor 12t varies. However, since the oxide semiconductor film 430a contains at least one of metal elements contained in the oxide semiconductor film 430b, an interface state is unlikely to be formed at the interface between the oxide semiconductor film 430b and the oxide semiconductor film 430a. Accordingly, the above structure allows reducing of variations in electrical characteristics of the transistor 12t, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous energy band, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1\times10^{-4}$ Pa) with use of a suction vacuum evacuation pump such as a cryopump so that water or the like, which is an impurity for the oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 430b is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor film 430b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a c-axis aligned crystalline oxide semiconductor (CAAC-OS) film as the oxide semiconductor film 430b is easily formed. Typical examples of the atomic ratio of the metal elements of the target are In:M:Zn=1:1:1 and In:M:Zn=3:1:2.

Specifically, in the case where the oxide semiconductor film 430a and the oxide semiconductor film 430c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 430a and 430c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 430a and 430c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 430a and the oxide semiconductor film 430c each have a thickness of more than or equal to 3 nm and less than or equal to 100 nm, preferably more than or equal to 3 nm and less than or equal to 50 nm. The thickness of the oxide semiconductor film 430b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 430a to 430c can be either amorphous or crystalline. Note that the oxide semiconductor film 430b in which a channel region is formed preferably has a crystalline structure, in which case the transistor 12t can have stable electrical characteristics.

Note that a channel formation region refers to a region of a semiconductor film of the transistor 12t that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 430a and 430c, the oxide semiconductor films 430a and 430c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the oxide semiconductor film 430b is a CAAC-OS film, the oxide semiconductor film 430b is preferably deposited with the use of a polycrystalline In—Ga—Zn oxide target containing In, Ga, and Zn in an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

There are few carrier generation sources in a highly purified oxide semiconductor (purified oxide semiconductor) obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor is controlled by the transistor. In the measurement, a highly purified oxide semiconductor film was used for a channel formation region of the transistor, and the off-state current of the transistor was measured from a change in the amount of charges of the capacitor per unit hour. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electric characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be formed over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio between In, Ga, and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 12t, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 12t, achieving the high-speed operation of a storage device using the transistor 12t.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material which is easily bonded to oxygen. Examples of such a conductive material include Al, Cr Cu, Ta, Ti, Mo, and W.

Furthermore, in the case where the semiconductor film including the stacked oxide semiconductor films is used in the transistor 12t, the n-type region preferably extends to the oxide semiconductor film 430b serving as a channel region in order that the mobility and on-state current of the transistor 12t can be further increased and the storage device can operate at higher speed.

The insulating film 422 preferably has a function of supplying part of oxygen to the oxide semiconductor films 430a to 430c by heating. It is preferable that the number of defects in the insulating film 422 be small, and typically the spin density of g=2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 12t illustrated in FIG. 11, the conductive film 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that do not overlap with the conductive films 432 and 433 overlap with the gate electrode 323 in the transistor 12t illustrated in FIG. 11. Consequently, current that flows between the conductive films 432 and 433 through the end portions of the oxide semiconductor film 430b can be controlled by the potential applied to the gate electrode 434. Such a structure of the transistor 12t is referred to as a surrounded channel (s-channel) structure.

With the s-channel structure, specifically, when a potential at which the transistor 12t is turned off is supplied to the gate electrode 434, the amount of off-state current that flows between the conductive films 432 and 433 through the end portions can be reduced. For this reason, in the transistor 12t, even when the distance between the conductive films 432 and 433 at the end portions of the oxide semiconductor film 430b is reduced as a result of reducing the channel length to obtain high on-state current, the transistor 12t can have low off-state current. Consequently, with the short channel length, the transistor 12t can have high on-state current when in an on state and low off-state current when in an off state.

With the s-channel structure, specifically, when a potential at which the transistor 12t is turned on is supplied to the gate electrode 434, the amount of current that flows between the conductive films 432 and 433 through the end portions of the oxide semiconductor film 430b can be increased. The current contributes to an increase in the field-effect mobility and the on-state current of the transistor 12t. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in carrier mobility the transistor 12t. As a result, the on-state current of the transistor 12t is increased, and the field-effect mobility is increased to greater than or equal to 10 cm$^2$/V×s or to greater than or equal to 20 cm$^2$V×s, for example. Note that here, the field-effect mobility is not an approximate value of the mobility as the physical property of the oxide semiconductor film but is an index of current drive capability and the apparent field-effect mobility of a saturation region of the transistor.

A structure of the oxide semiconductor film is described below.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. In addition, the term "substantially perpendicular" indicates that the angle formed between two straight lines is greater than or equal to 80° and less than or equal to 100°, and accordingly includes the case where the angle is greater than or equal to 85° and less than or equal to 95°. In addition, the term "substantially perpendicular" indicates that the angle formed between two straight lines is greater than or equal to 60° and less than or equal to 120°. In this specification, trigonal and rhombohedral crystal systems are included in a hexagonal crystal system.

An oxide semiconductor film is classified roughly into a single-crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

When observing the CAAC-OS film in a combined analysis image of a bright-field image and a diffraction pattern with the use of a transmission electron microscope (TEM) (the combined analysis image is also referred to as a high-resolution TEM image), a plurality of crystal parts can be found. However, in the high-resolution TEM image, a boundary between crystal parts, that is, a grain boundary is not clearly found. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In a high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film including an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has a higher strength of bonding to oxygen than that of a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor using the oxide semiconductor film rarely has negative threshold voltage (is rarely normally on). The highly purified intrinsic or substantially highly purified intrinsic oxide semiconductor film has few carrier traps. Accordingly, the transistor using the oxide semiconductor film has little change in electrical characteristics and high reliability. Electrical charges trapped by the carrier traps in the oxide semiconductor film take a long time to be released, and might behave like fixed electrical charges. Thus, the transistor that uses the oxide semiconductor film having high impurity concentration and a high density of defect states has unstable electrical characteristics in some cases.

With the use of the CAAC-OS film in a transistor, a change in the electrical characteristics of the transistor due to irradiation with visible light or ultraviolet light is small.

Next, a microcrystalline oxide semiconductor film is described.

A microcrystalline oxide semiconductor film has a region where a crystal part can be found in the high-resolution TEM image and a region where a crystal part cannot be found clearly in the high-resolution TEM image. In most cases, a crystal part in the microcrystalline oxide semiconductor film is greater than or equal to 1 nm and less than or equal to 100 nm, or greater than or equal to 1 nm and less than or equal to 10 urn A microcrystal with a size greater than or equal to 1 urn and less than or equal to 10 urn, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM image of the nc-OS film, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are observed in a nanobeam electron diffraction pattern of the nc-OS film that is obtained by using an electron beam having a probe diameter close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots are observed in a ring-like region in some cases.

The nc-OS film is an oxide semiconductor film having more regularity than an amorphous oxide semiconductor film; thus, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film is described.

The amorphous oxide semiconductor film has disordered atomic arrangement and no crystal part. For example, the amorphous oxide semiconductor film does not have a specific state like quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the $InGaZnO_4$ crystal, focusing on the lattice fringes in the high-resolution TEM image.

Furthermore, the density of an oxide semiconductor varies depending on the structure in some cases. For example, when the composition of an oxide semiconductor film is determined, the structure of the oxide semiconductor can be expected by comparing the density of the oxide semiconductor film with the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor having a density of lower than 78% of the density of the single crystal oxide semiconductor film.

Specific examples of the above description are given. For example, in an oxide semiconductor film in which the atomic ratio of In to Ga and Zn is 1:1:1, the density of a single crystal of $InGaZnO_4$ with a rhombohedral crystal structure is 6.357 $g/cm^3$. Accordingly, in the oxide semiconductor film in which the atomic ratio of In to Ga and Zn is 1:1:1, the density of the a-like OS film is higher than or equal to 5.0 $g/cm^3$ and lower than 5.9 $g/cm^3$, and the density of the nc-OS film and the CAAC-OS film is higher than or equal to 5.9 $g/cm^3$ and lower than 6.3 $g/cm^3$.

However, there might be no single crystal oxide semiconductor film having the same composition as the oxide semiconductor film. In that case, single crystal oxide semiconductor films with different compositions are combined in an adequate ratio to calculate the density equivalent to that of a single crystal oxide semiconductor film with the desired composition. The density of the single crystal oxide semiconductor film with the desired composition may be obtained by calculating the weighted average of the film densities of the single crystal oxide semiconductor films with the different compositions in consideration of the combination ratio therebetween. Note that it is preferable to use as few kinds of single crystal oxide semiconductor film as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the treatment chamber may be reduced. The concentration of impurities in a deposition gas may also be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches the substrate. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like or pellet-like sputtered particle reaches the substrate, migration occurs on the substrate, so that a flat plane of the sputtered particle is attached to the substrate.

Furthermore, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the target, an In—Ga—Zn oxide target is described below.

The In—Ga—Zn oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on a target to be formed.

An alkali metal is not a constituent element of an oxide semiconductor and thus is an impurity. Also, alkaline earth metal is an impurity in the case where the alkaline earth metal is not a constituent element of the oxide semiconductor. Alkali metal, in particular, Na becomes $Na^+$ when an insulating film in contact with the oxide semiconductor film is an oxide and Na diffuses into the insulating film. In addition, in the oxide semiconductor film, Na cuts or enters a bond between metal and oxygen which are included in the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measured Li concentration is preferably $5 \times 10^{15}/cm^3$ or lower, further preferably $1 \times 10^{15}/cm^3$ or lower. Similarly, the measured K concentration is preferably $5 \times 10^{15}/cm^3$ or lower, further preferably $1 \times 10^{15}/cm^3$ or lower.

In the case where a metal oxide containing indium is used, silicon or carbon having higher bond energy with oxygen than that of indium might cut the bond between indium and oxygen, so that an oxygen vacancy is formed. Accordingly, when silicon or carbon is contained in the oxide semiconductor film, the electrical characteristics of the transistor are likely to deteriorate as in the case of using an alkali metal or an alkaline earth metal. Thus, the concentration of silicon and the concentration of carbon in the oxide semiconductor film are preferably low. Specifically, the C concentration or the Si concentration measured by secondary ion mass spectrometry is preferably less than or equal to $1 \times 10^{18}/cm^3$. In this case, the deterioration of the electrical characteristics of the transistor can be prevented, so that the reliability of a storage device can be improved.

<Examples of Electronic Device>

A semiconductor device or programmable logic device of one embodiment of the present invention can be used for display devices, personal computers, or image reproducing devices provided with recording media (typically, devices that reproduce the content of recording media such as digital versatile discs (DVD) and have displays for displaying the reproduced images). Further, as electronic devices that can include the semiconductor device or programmable logic device of one embodiment of the present invention, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 12A to 12F illustrate specific examples of these electronic devices.

Figure 12A:
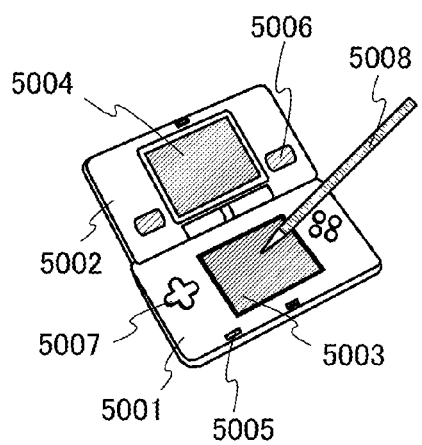
FIGS. 12A to 12F illustrate electronic devices.

FIG. 12A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for a variety of integrated circuits included in portable game machines. Although the portable game machine in FIG. 12A has the two display portions 5003 and 5004, the number of display portions included in the portable game machine is not limited thereto.

Figure 12B:
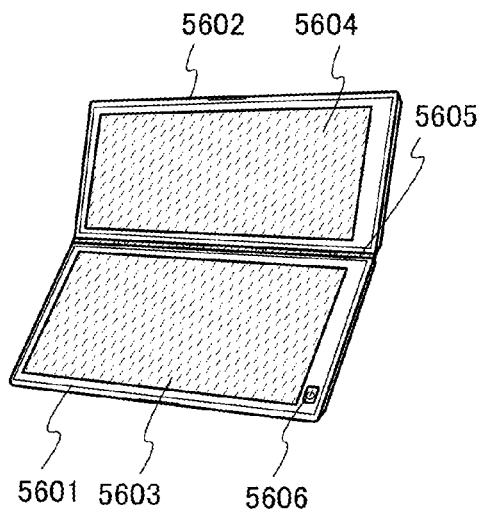

FIG. 12B illustrates a portable information terminal, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 12C:
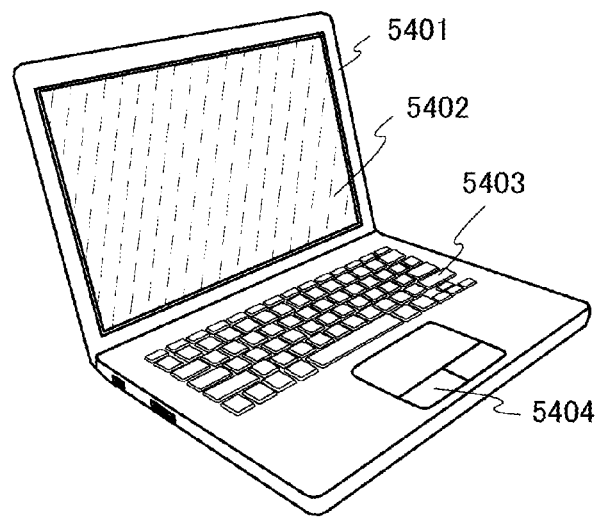

FIG. 12C illustrates a laptop, which includes a housing 5401, a display portion 5402, a keyboard 5403, a pointing device 5404, and the like. The semiconductor device of one embodiment of the present invention can be used for a variety of integrated circuits included in notebook personal computers.

Figure 12D:
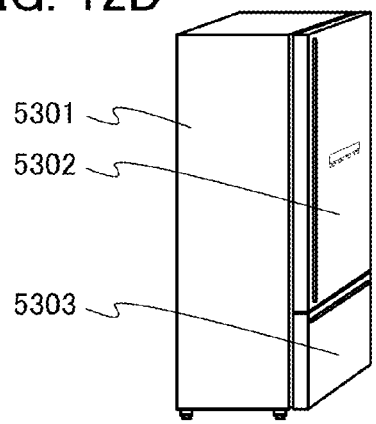

FIG. 12D illustrates an electric refrigerator-freezer, which includes a housing 5301, a refrigerator door 5302, a freezer door 5303, and the like. The semiconductor device of one embodiment of the present invention can be used for a variety of integrated circuits included in electric refrigerator-freezers.

Figure 12E:
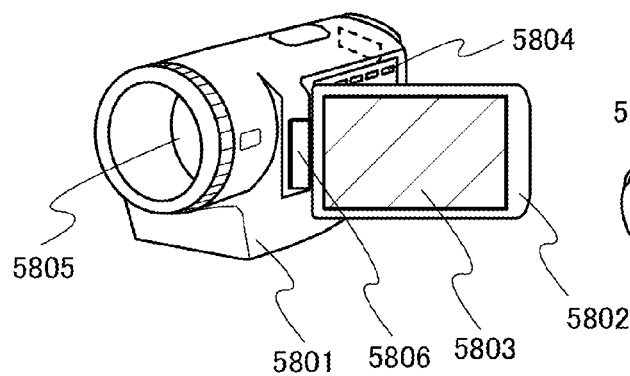

FIG. 12E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 12F:
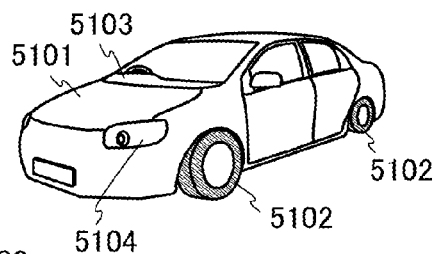

FIG. 12F illustrates an automobile, which includes a car body 5101, wheels 5102, a dashboard 5103, lights 5104, and the like. The semiconductor device of one embodiment of the present invention can be used for a variety of integrated circuits included in automobiles.

<Other>

For example, in this specification and the like, an explicit description "X and Y are connected" means that X and Y are electrically connected, X and Y are functionally connected, and X and Y are directly connected. Here, X and Y each denote an object (e.g., a device, an element, a circuit, a wiring, an electrode, a terminal, a conductive film, a layer, or the like). Accordingly, without limiting to a predetermined connection relation, for example, a connection relation shown in drawings and texts, another element may be interposed between elements having the connection relation shown in the drawings and the texts.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit expression "X and Y are electrically connected" is the same as the explicit simple expression "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

In this specification and the like, any of a variety of switches can be used as a switch. That is, the switch has a function of determining whether current flows or not by being turning on or off (being brought into an on state or an off state). Alternatively, the switch has a function of selecting and changing a current path. For example, the switch has a function of determining whether current can flow through a path 1 or a path 2 and switching the paths. For example, an electrical switch, a mechanical switch, or the like can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a logic circuit in which such elements are combined, or the like can be used as a switch. An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

Note that a CMOS switch including both n-channel and p-channel transistors may be employed as a switch. The use of a CMOS switch as a switch allows more accurate operation of the switch because a current can flow when either the p-channel transistor or the n-channel transistor is turned on. Thus, a voltage can be appropriately output regardless of whether the voltage of an input signal to the switch is high or low. Alternatively, the voltage amplitude of a signal for turning on or off the switch can be made small, so that power consumption can be reduced.

Note that when a transistor is used as a switch, the switch includes an input terminal (one of a source and a drain), an output terminal (the other of the source and the drain), and a terminal for controlling conduction (a gate) in some cases. When a diode is used as a switch, the switch does not have a terminal for controlling conduction in some cases. Therefore, when a diode is used as a switch, the number of wirings for controlling terminals can be small as compared with the case of using a transistor as a switch.

Note that in this specification and the like, for example, a transistor with a multi-gate structure having two or more gate electrodes can be used as a transistor. With the multi-gate structure, a structure where a plurality of transistors are connected in series is provided because channel regions are connected in series. Thus, with the multi-gate structure, the amount of off-state current can be reduced and the withstand voltage of the transistor can be increased (reliability can be improved). Alternatively, with the multi-gate structure, the drain-source current does not change so much even if the drain-source voltage fluctuates when the transistor operates in a saturation region, so that a flat slope of the voltage-current characteristics can be obtained. By utilizing the flat slope of the voltage-current characteristics, an ideal current source circuit or an active load having extremely high resistance can be obtained. Accordingly, a differential circuit, a current mirror circuit, or the like having excellent properties can be obtained.

Note that, for example, a transistor with a structure where gate electrodes are provided above and below a channel can be used as a transistor. With the structure where the gate electrodes are provided above and below the channel, a circuit structure where a plurality of transistors are connected in parallel is provided. Thus, a channel region is increased, so that the amount of current can be increased. When the structure where the gate electrodes are provided above and below the channel is employed, a depletion layer is easily formed; thus, the subthreshold swing (S value) can be improved.

Note that for example, a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like can be used as a transistor. A transistor with any of a variety of structures such as a planar type, a FIN-type, a Tri-Gate type, a top-gate type, a bottom-gate type, a double-gate type (with gates above and below a channel), and the like can be used.

For example, in this specification and the like, a transistor is an element having at least three terminals: a gate, a drain, and a source. The transistor has a channel region between the drain (a drain terminal, a drain region, or a drain electrode) and the source (a source terminal, a source region, or a source electrode) and can supply current through the drain, the channel region, and the source. Here, since the source and the drain of the transistor change depending on the structure, operating condition, and the like of the transistor, it is difficult to define which is a source or a drain. Thus, a region which serves as a source or a region which serves as a drain is not referred to as a source or a drain in some cases. In that case, one of the source and the drain might be referred to as a first terminal, a first electrode, or a first region, and the other of the source and the drain might be referred to as a second terminal, a second electrode, or a second region, for example.

Note that in this specification and the like, a transistor can be formed using any of a variety of substrates, for example. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of the flexible substrate are flexible synthetic resin substrates such as substrates of plastics typified by polyethylene terephthalate (PET), polyethylene naphthalate (PEN), and polyether sulfone (PES) and an acrylic substrate. An example of the attachment film is an attachment film formed using polypropylene, polyester, polyvinyl fluoride, polyvinyl chloride, or the like. An example of the base film is a base film formed using polyester, polyamide, polyimide, an inorganic vapor deposition film, paper, or the like. Specifically, when a transistor is formed using a semiconductor substrate, a single crystal substrate, an SOI substrate, or the like, the transistor can have few variations in characteristics, size, shape, or the like, high current supply capability, and a small size. Formation a circuit with the use of such transistors leads to a reduction in power consumption of the circuit or high integration of the circuit.

Note that a transistor may be formed using a substrate, and then, the transistor may be transferred to another substrate. Example of a substrate to which a transistor is transferred are, in addition to the above substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

Note that all the circuits which are necessary to realize a desired function can be formed using one substrate (e.g., a glass substrate, a plastic substrate, a single crystal substrate, or an SOI substrate). In this manner, the cost can be reduced by a reduction in the number of components or reliability can be improved by a reduction in the number of connection points to circuit components.

Note that not all the circuits which are necessary to realize the predetermined function are needed to be formed using one substrate. That is, part of the circuits which are necessary to realize the predetermined function may be formed using a substrate and another part of the circuits which are necessary to realize the predetermined function may be formed using another substrate. For example, part of the circuits which are necessary to realize the predetermined function can be formed using a glass substrate and another part of the circuits which are necessary to realize the predetermined function can be formed using a single crystal substrate (or an SOI substrate). The single crystal substrate over which the another part of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate by TAB (tape automated bonding), COF (chip on film), SMT (surface mount technology), a printed circuit board, or the like. When part of the circuits is formed over the same substrate as a pixel portion in this manner, the cost can be reduced by a reduction in the number of components or reliability can be improved by a reduction in the number of connection points between circuit components. In particular, a circuit in a portion where a driving voltage is high, a circuit in a portion where a driving frequency is high, or the like consumes much power in many cases. In view of the above, such a circuit is formed over a substrate (e.g., a single crystal substrate) different from a substrate over which a pixel portion is formed, whereby an IC chip is formed. The use of this IC chip allows prevention of increase in power consumption.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among component.

Note that the positional relations of circuit blocks in block diagrams are specified for description, and even in the case where different circuit blocks have different functions, the different circuit blocks might be provided in an actual circuit or an actual region so that different functions are achieved in the same circuit or the same region. The functions of circuit blocks in block diagrams are specified for description, and even in the case where one circuit block is illustrated, blocks might be provided in an actual circuit or an actual region so that processing performed by one circuit block is performed by a plurality of circuit blocks.

EXPLANATION OF REFERENCE

10: switch circuit, 10a: switch circuit, 10a1: switch circuit, 10a2: switch circuit, 10a3: switch circuit, 10b: switch circuit, 10b1: switch circuit, 10b2: switch circuit, 10b3: switch circuit, 11: transistor, 12: switch, 12t: transistor, 13: switch, 13t: transistor, 14: switch, 14t: transistor, 15: diode, 15t: transistor, 16: diode, 16t: transistor, 20: semiconductor device, 21: component, 22: component, 30: semiconductor device, 31a: CPU, 31b: CPU, 32: MS, 32a: MS, 32b: MS, 33: CCU, 34: DD, 34a: DD, 34b: DD, 400: substrate, 401: element isolation region, 402: impurity region, 403: impurity region, 404: channel formation region, 405: insulating film, 406: gate electrode, 411: insulating film, 412: conductive film, 413: conductive film, 414: conductive film, 416: conductive film, 417: conductive film, 418: conductive film, 420: insulating film, 421: insulating film, 422: insulating film, 430: semiconductor film, 430a: oxide semiconductor film, 430b: oxide semiconductor film, 430c: oxide semiconductor film, 431: gate insulating film, 432: conductive film, 433: conductive film, 434: gate electrode, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, 5806: joint.

This application is based on Japanese Patent Application serial no. 2013-199115 filed with Japan Patent Office on Sep. 26, 2013, the entire contents of which are hereby incorporated by reference.

The invention claimed is:

1. A semiconductor device comprising:
   a first transistor;
   a second transistor;
   a third transistor;
   a fourth transistor, a gate of the fourth transistor being electrically connected to one of a source or a drain of the fourth transistor; and
   a fifth transistor, a gate of the fifth transistor being electrically connected to one of a source or a drain of the fifth transistor,
   wherein one of a source or a drain of the first transistor is electrically connected to a gate of the first transistor through the second transistor and the fourth transistor, and
   wherein the other of the source and the drain of the first transistor is electrically connected to the gate of the first transistor through the third transistor and the fifth transistor.

2. The semiconductor device according to claim 1, wherein at least one of the second transistor and the third transistor is a transistor comprising a channel formation region comprising an oxide semiconductor.

3. The semiconductor device according to claim 1, wherein the first transistor is configured to be turned off by supplying a potential lower than a potential of the gate of the first transistor to the one of the source or the drain of the first transistor while the second transistor is turned on.

4. The semiconductor device according to claim 1, wherein the first transistor is configured to be turned on by supplying a potential not lower than a potential of the gate of the first transistor to the one of the source or the drain of the first transistor and the other of the source and the drain of the first transistor while the second transistor and the third transistor are turned on.

5. The semiconductor device according to claim 1, wherein the first transistor is configured to be turned off by supplying a potential lower than a potential of the gate of the first transistor to the one of the source or the drain of the first transistor while the second transistor is turned on, and
wherein the first transistor is configured to be turned on by supplying a potential not lower than a potential of the gate of the first transistor to the one of the source or the drain of the first transistor and the other of the source and the drain of the first transistor while the second transistor and the third transistor are turned on.

6. The semiconductor device according to claim 1, wherein the first transistor is configured to be turned off by supplying a potential lower than a potential of the gate of the first transistor to the one of the source or the drain of the first transistor while the second transistor is turned on after a high-level potential is supplied to the gate of the first transistor, and
wherein the first transistor is configured to be turned on by supplying a potential not lower than a potential of the gate of the first transistor to the one of the source or the drain of the first transistor and the other of the source and the drain of the first transistor while the second transistor and the third transistor are turned on after a high-level potential is supplied to the gate of the first transistor.

7. The semiconductor device according to claim 1,
wherein the first transistor is configured to be turned off by supplying a potential lower than a potential of the gate of the first transistor to the one of the source or the drain of the first transistor while the second transistor is turned on and then turned off after a high-level potential is supplied to the gate of the first transistor, and
wherein the first transistor is configured to be turned on by supplying a potential not lower than a potential of the gate of the first transistor to the one of the source or the drain of the first transistor and the other of the source and the drain of the first transistor while the second transistor and the third transistor are turned on and then turned off after a high-level potential is supplied to the gate of the first transistor.

8. The semiconductor device according to claim 1, further comprising a sixth transistor,
wherein the gate of the first transistor is electrically connected to one of a source or a drain of the sixth transistor,
wherein the first transistor is configured to be turned off by supplying a potential lower than a potential of the gate of the first transistor to the one of the source or the drain of the first transistor while the second transistor is turned on and then turned off after a high-level potential is supplied to the gate of the first transistor through the sixth transistor, and
wherein the first transistor is configured to be turned on by supplying a potential not lower than a potential of the gate of the first transistor to the one of the source or the drain of the first transistor and the other of the source and the drain of the first transistor while the second transistor and the third transistor are turned on and then turned off after a high-level potential is supplied to the gate of the first transistor through the sixth transistor.

9. The semiconductor device according to claim 1,
wherein the first transistor is configured to be turned off by supplying a potential higher than a potential of the gate of the first transistor to the one of the source or the drain of the first transistor while the second transistor is turned on, and
wherein the first transistor is configured to be turned on by supplying a potential not higher than a potential of the gate of the first transistor to the one of the source or the drain of the first transistor and the other of the source and the drain of the first transistor while the second transistor and the third transistor are turned on.

10. The semiconductor device according to claim 1,
wherein the first transistor is configured to be turned off by supplying a potential higher than a potential of the gate of the first transistor to the one of the source or the drain of the first transistor while the second transistor is turned on after a low-level potential is supplied to the gate of the first transistor, and
wherein the first transistor is configured to be turned on by supplying a potential not higher than a potential of the gate of the first transistor to the one of the source or the drain of the first transistor and the other of the source and the drain of the first transistor while the second transistor and the third transistor are turned on after a low-level potential is supplied to the gate of the first transistor.

11. The semiconductor device according to claim 1,
wherein the first transistor is configured to be turned off by supplying a potential higher than a potential of the gate of the first transistor to the one of the source or the drain of the first transistor while the second transistor is turned on and then turned off after a low-level potential is supplied to the gate of the first transistor, and
wherein the first transistor is configured to be turned on by supplying a potential not higher than a potential of the gate of the first transistor to the one of the source or the drain of the first transistor and the other of the source and the drain of the first transistor while the second transistor and the third transistor are turned on and then turned off after a low-level potential is supplied to the gate of the first transistor.

12. The semiconductor device according to claim 1, further comprising a sixth transistor,
wherein the gate of the first transistor is electrically connected to one of a source or a drain of the sixth transistor,
wherein the first transistor is configured to be turned off by supplying a potential higher than a potential of the gate of the first transistor to the one of the source or the drain of the first transistor while the second transistor is turned on and then turned off after a low-level potential is supplied to the gate of the first transistor through the sixth transistor, and
wherein the first transistor is configured to be turned on by supplying a potential not higher than a potential of the gate of the first transistor to the one of the source or the drain of the first transistor and the other of the source and the drain of the first transistor while the second transistor and the third transistor are turned on and then turned off after a low-level potential is supplied to the gate of the first transistor through the sixth transistor.

13. A system comprising:
a first component;
a second component; and
the semiconductor device according to claim 1,
wherein the semiconductor device is between the first component and the second component and is configured to electrically connect the first component and the second component.

14. A semiconductor device comprising:
a first transistor;
a second transistor;
a third transistor;
a fourth transistor; and
a fifth transistor,
wherein one of a source or a drain of the first transistor is electrically connected to a gate of the first transistor through the second transistor and the fourth transistor, and
wherein the other of the source and the drain of the first transistor is electrically connected to the gate of the first transistor through the third transistor and the fifth transistor.

15. The semiconductor device according to claim 14,
wherein at least one of the second transistor and the third transistor is a transistor comprising a channel formation region comprising an oxide semiconductor.

16. The semiconductor device according to claim 14,
wherein one of a source or a drain of the second transistor is electrically connected to the gate of the first transistor, wherein the other of the source and the drain of the second transistor is electrically connected to one of a source or a drain of the fourth transistor and a gate of the fourth transistor, wherein the other of the source and the drain of the fourth transistor is electrically connected to the one of the source or the drain of the first transistor, wherein one of a source or a drain of the third transistor is electrically connected to the gate of the first transistor, wherein the other of the source and the drain of the third transistor is electrically connected to one of a source or a drain of the fifth transistor and a gate of the fifth transistor, and wherein the other of the source and the drain of the fifth transistor is electrically connected to the other of the source and the drain of the first transistor.

17. The semiconductor device according to claim 14, wherein one of a source or a drain of the second transistor is electrically connected to the one of the source or the drain of the first transistor, wherein the other of the source and the drain of the second transistor is electrically connected to one of a source or a drain of the fourth transistor, wherein the other of the source and the drain of the fourth transistor is electrically connected to the gate of the first transistor and a gate of the fourth transistor, wherein one of a source or a drain of the third transistor is electrically connected to the other of the source and the drain of the first transistor, wherein the other of the source and the drain of the third transistor is electrically connected to one of a source or a drain of the fifth transistor, and wherein the other of the source and the drain of the fifth transistor is electrically connected to the gate of the first transistor and a gate of the fifth transistor.

18. A system comprising:
a first component;
a second component; and
the semiconductor device according to claim 14,
wherein the semiconductor device is between the first component and the second component and is configured to electrically connect the first component and the second component.

19. A semiconductor device comprising:
a first transistor;
a second transistor;
a third transistor;
a fourth transistor;
a fifth transistor; and
a sixth transistor,
wherein one of a source or a drain of the first transistor is electrically connected to a gate of the first transistor through the second transistor and the fourth transistor,
wherein the other of the source and the drain of the first transistor is electrically connected to the gate of the first transistor through the third transistor and the fifth transistor, and wherein one of a source or a drain of the sixth transistor is electrically connected to the gate of the first transistor.

20. The semiconductor device according to claim 19,
wherein at least one of the second transistor and the third transistor is a transistor comprising a channel formation region comprising an oxide semiconductor.

21. The semiconductor device according to claim 19,
wherein one of a source or a drain of the second transistor is electrically connected to the gate of the first transistor, wherein the other of the source and the drain of the second transistor is electrically connected to one of a source or a drain of the fourth transistor and a gate of the fourth transistor, wherein the other of the source and the drain of the fourth transistor is electrically connected to the one of the source or the drain of the first transistor, wherein one of a source or a drain of the third transistor is electrically connected to the gate of the first transistor, wherein the other of the source and the drain of the third transistor is electrically connected to one of a source or a drain of the fifth transistor and a gate of the fifth transistor, and wherein the other of the source and the drain of the fifth transistor is electrically connected to the other of the source and the drain of the first transistor.

22. The semiconductor device according to claim 19,
wherein one of a source or a drain of the second transistor is electrically connected to the one of the source or the drain of the first transistor, wherein the other of the source and the drain of the second transistor is electrically connected to one of a source or a drain of the fourth transistor, wherein the other of the source and the drain of the fourth transistor is electrically connected to the gate of the first transistor and a gate of the fourth transistor, wherein one of a source or a drain of the third transistor is electrically connected to the other of the source and the drain of the first transistor, wherein the other of the source and the drain of the third transistor is electrically connected to one of a source or a drain of the fifth transistor, and wherein the other of the source and the drain of the fifth transistor is electrically connected to the gate of the first transistor and a gate of the fifth transistor.

23. A system comprising:
a first component;
a second component; and
the semiconductor device according to claim 19,
wherein the semiconductor device is between the first component and the second component and is configured to electrically connect the first component and the second component.

* * * * *